United States Patent
Aoki

(10) Patent No.: US 10,140,940 B2
(45) Date of Patent: Nov. 27, 2018

(54) DISPLAY DEVICE

(71) Applicant: Japan Display Inc., Minato-ku (JP)

(72) Inventor: Yoshiro Aoki, Tokyo (JP)

(73) Assignee: Japan Display Inc., Minato-ku (JP)

(*) Notice: Subject to any disclaimer, the term of this patent is extended or adjusted under 35 U.S.C. 154(b) by 261 days.

(21) Appl. No.: 15/206,779

(22) Filed: Jul. 11, 2016

(65) Prior Publication Data

US 2017/0025080 A1    Jan. 26, 2017

(30) Foreign Application Priority Data

Jul. 24, 2015 (JP) .................................. 2015-146449
Jan. 28, 2016 (JP) .................................. 2016-014336

(51) Int. Cl.
| G09G 3/36 | (2006.01) |
| H01L 29/786 | (2006.01) |
| G02F 1/1362 | (2006.01) |
| G02F 1/1368 | (2006.01) |

(52) U.S. Cl.
CPC ......... *G09G 3/3648* (2013.01); *G09G 3/3614* (2013.01); *H01L 29/786* (2013.01); *G02F 1/1368* (2013.01); *G02F 1/13624* (2013.01); *G02F 2001/13685* (2013.01); *G09G 2300/0852* (2013.01); *G09G 2300/0876* (2013.01); *G09G 2330/023* (2013.01)

(58) Field of Classification Search
CPC ............... G09G 3/3648; G09G 3/3614; G09G 2300/0852; G09G 2300/0876; G09G 2330/023; H01L 29/786; G02F 1/13624; G02F 1/1368; G02F 2001/13685

USPC .......................................................... 345/214
See application file for complete search history.

(56) References Cited

U.S. PATENT DOCUMENTS

| 7,924,354 B2* | 4/2011 | Lu ..................... G02F 1/134309 257/59 |
| 8,928,643 B2* | 1/2015 | Lueder ................. G09G 3/3648 345/211 |
| 9,013,373 B2* | 4/2015 | Takasugi .............. G09G 3/3233 345/76 |
| 2005/0156829 A1* | 7/2005 | Choi .................... G09G 3/3233 345/76 |
| 2005/0225683 A1* | 10/2005 | Nozawa ............... G09G 3/2014 348/801 |
| 2006/0132417 A1* | 6/2006 | Shigenobu ........... G09G 3/3696 345/98 |

(Continued)

FOREIGN PATENT DOCUMENTS

| JP | 2003-228341 | 8/2003 |
| JP | 2009-282119 | 12/2009 |

*Primary Examiner* — Amare Mengistu
*Assistant Examiner* — Gloryvid Figueroa-Gibson
(74) *Attorney, Agent, or Firm* — Oblon, McClelland, Maier & Neustadt, L.L.P.

(57) ABSTRACT

According to one embodiment, a display device has a display area and pixels forming a matrix pattern. Each of the pixels has a display element and a capacitive element series circuit, and a capacitive element series circuit includes a first capacitive element and a second capacitive element. Some switches in a boost control circuit are controlled by a gate signal during one pulse period of an input source signal at least two times. The switches include, a switch being opening and/or closing in a first half of the pulse period, and a switch being closing and/or opening in a second half of the pulse period.

10 Claims, 15 Drawing Sheets

(56) References Cited

U.S. PATENT DOCUMENTS

2009/0289888 A1  11/2009  Aoki et al.
2012/0320293 A1* 12/2012  Wang ................ G02F 1/134336
                                                    349/38
2017/0047005 A1*  2/2017  Jinta .................... G09G 3/3233

* cited by examiner

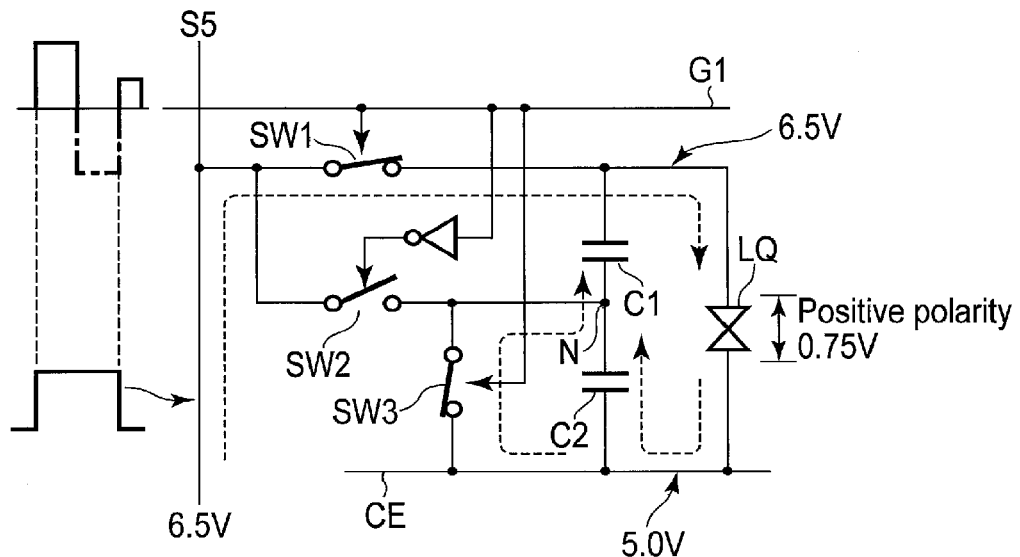
F I G. 2A
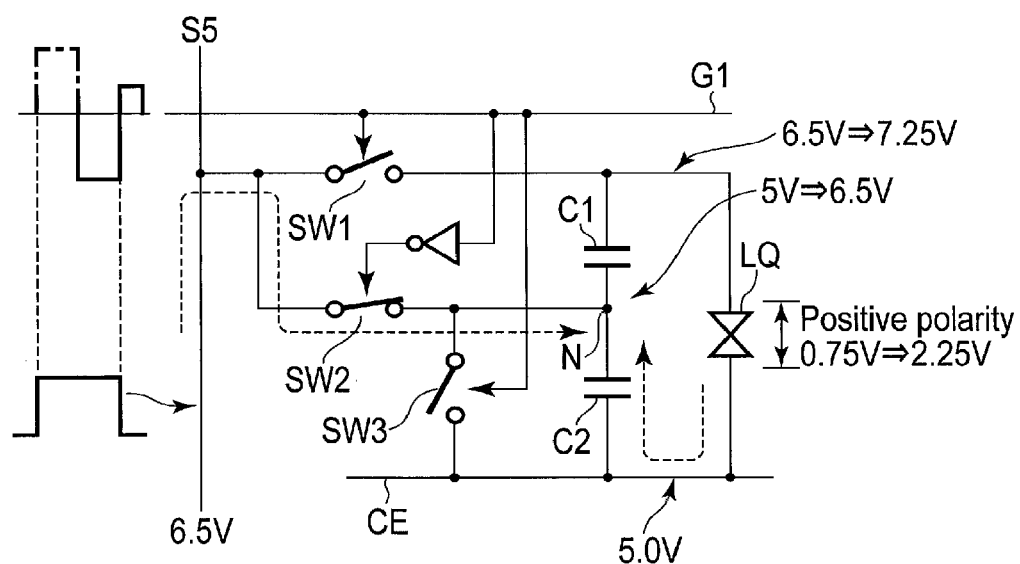
F I G. 2B

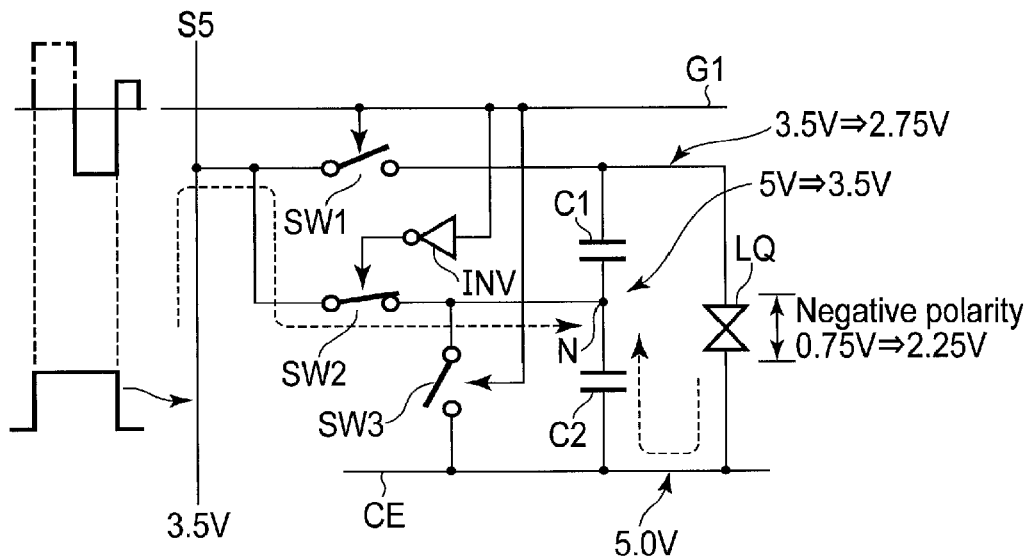
F I G. 2E
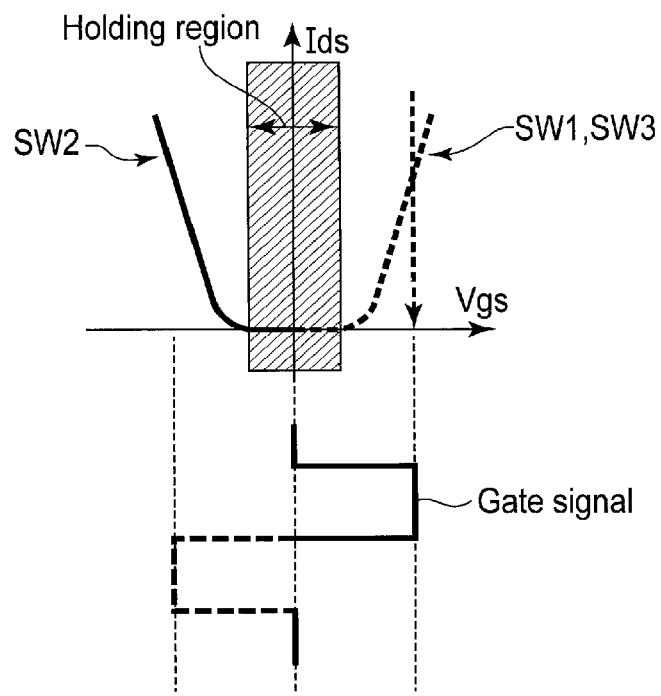
F I G. 3A

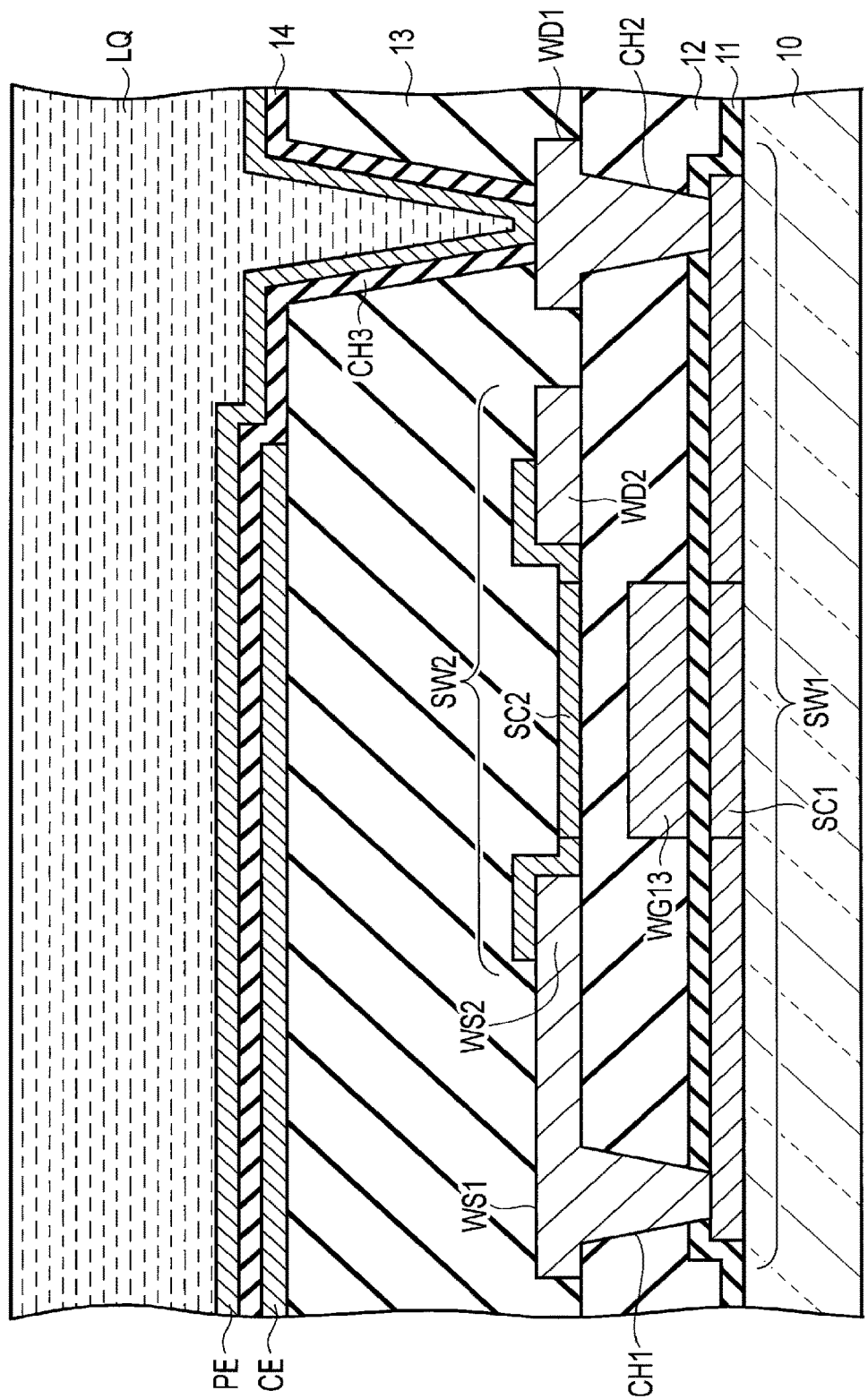
F I G. 9

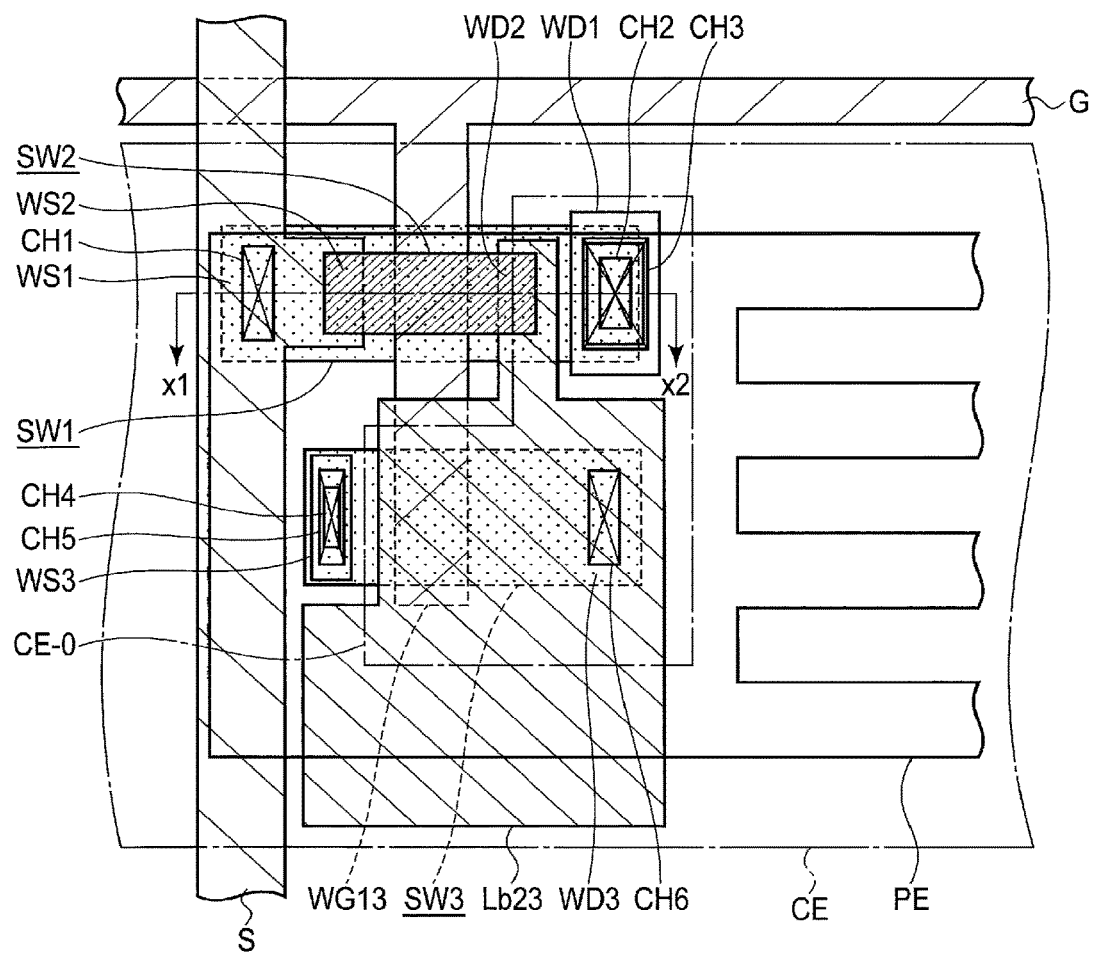
F I G. 10

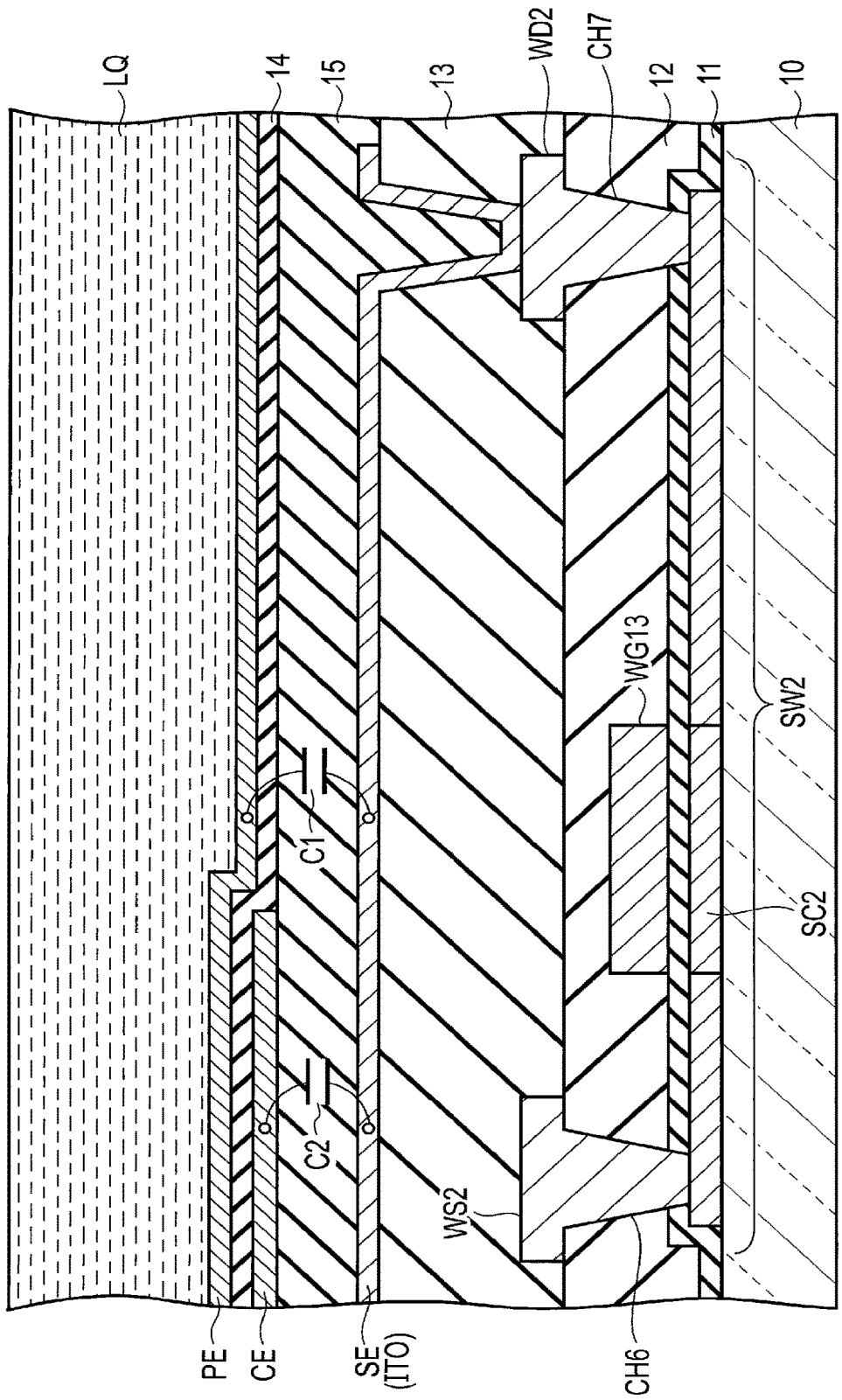
F I G. 12

US 10,140,940 B2

DISPLAY DEVICE

CROSS-REFERENCE TO RELATED APPLICATIONS

This application is based upon and claims the benefit of priority from Japanese Patent Applications No. 2015-146449, filed Jul. 24, 2015; and No. 2016-014336, filed Jan. 28, 2016, the entire contents of all of which are incorporated herein by reference.

FIELD

Embodiments described herein relate generally to a display device.

BACKGROUND

Recently, portable devices (personal computers, personal digital assistants [PDAs], tablet computers, etc.) are widely used, and display images are very high in definition. A portable device which is very high definition has a huge amount of pixels as its display section of a liquid crystal display. The liquid crystal display is driven by a driver IC chip. The driver IC chip is formed of an integrated circuit comprising silicon semiconductor elements. Since any display image is very high definition as described above, output lines extending from the integrated circuit are very large in number.

As a result, in liquid crystal display which is very high definition, a driver IC chip consumes much more energy than former driver IC chips do. Since the energy consumed by a driver IC chip is increased, it becomes more difficult to drive a portable device for a long time with a battery.

With a view to lower power consumption, there is proposed a method that is suppress amplitude of voltage and drive a liquid crystal display by low voltage amplitude.

In order to implement the proposed method, it is necessary to develop a new liquid crystal material which can operate with low-voltage amplitude. However, an inexpensive liquid crystal material which operates with low-voltage amplitude has not yet been developed.

It has been once studied to make an amplifier within a pixel using a low-temperature-polysilicon element which is expected to be low in energy consumption. If amplifiers on a glass substrate using low temperature polysilicon elements are composed, there are problems of the low temperature polysilicon elements having a wide range of characteristic variation, and it is difficult to obtain an amplification characteristic sufficient for an amplifier. Therefore such amplifiers did not be achieved.

Since the display image of a liquid crystal display is very high definition as described above, the count of output terminals from an integrated circuit is very large. For this reason, the energy consumed by a driver IC chip (sometimes also called a liquid crystal driver) is markedly large in comparison with the past.

BRIEF DESCRIPTION OF THE DRAWINGS

FIG. 2A illustrates a pixel circuit in the embodiment, and is a view specifically illustrating the basic structure of the pixel circuit for explaining a first step of a positive polarity operation into which the pixel circuit is brought.

FIG. 2B illustrates the pixel circuit of the embodiment, and is a view specifically illustrating the basic structure of the pixel circuit for explaining a second step of the positive polarity operation into which the pixel circuit is brought.

FIG. 2E illustrates the pixel circuit of the embodiment, and is a view specifically illustrating the basic structure of the pixel circuit for explaining a second step of the negative polarity operation into which the pixel circuit is brought.

FIG. 3A is an operating characteristic view explanatorily illustrating an exemplary first operational step which the pixel circuit of the embodiment performs.

FIG. 9 illustrates a further embodiment, and is a schematic sectional view structurally illustrating a first switch SW1 and a second switch SW2, each made of a corresponding one of semiconductor elements formed in a first substrate SUB1.

FIG. 10 is a plan view schematically illustrating from above an arrangement of the first switch SW1, the second switch SW2, and a third switch SW3, each of the switches made of a corresponding one of semiconductor elements formed in the first substrate SUB1.

FIG. 12 illustrates a yet further embodiment, and is a schematic sectional view structurally illustrating a second switch SW2 made of a semiconductor element formed in a first substrate SUB1.

DETAILED DESCRIPTION

Various embodiments will be described hereinafter with reference to the accompanying drawings.

In general, according to one embodiment, it is provided a display device which is useful to obtain a display image very high definition by increasing number of pixels, and reducing of energy consuming by a driver IC chip.

A display device in one embodiment has pixels which form a matrix pattern at a display area. A pixel comprises a display element LQ and at least two capacitive elements, one being a first capacitive element C1 and the other a second capacitive element C2. The first capacitive element C1 and the second capacitive element C2 are connected in series with each other to constitute a capacitive element series circuit, this capacitive element series circuit is connected in parallel with the display element LQ. The pixel has a boost control circuit (may be called boost circuit) to boost an electric potential of the series circuit. The boost control circuit has a plurality of switches. Each of the switches is controlled by a gate signal during one pulse period of an input source signal. Each pulse period has a first half and the last half. At least one of the switches opens in the first half of the pulse period and closes in the last half of the pulse period, whereas the rest of the switches close in the first half of the pulse period and open in the last half of the pulse period.

The embodiment will be further explained in detail. It should be noted that what is disclosed here are only some examples, and that any improvement which a person skilled in the art easily conceives based on the disclosure should naturally come within the scope of the present invention, as long as the main point of the present invention is maintained. Although there is a case in which each part including width, thickness, and shape may be illustrated schematically in comparison with an actual mode in order to make the description much clearer, the interpretation of the present invention is not restricted by such an illustration. Moreover, those components, each being identical or similar in function to a component previously described and illustrated in the specification and one or some of the drawings, are denoted by the same reference numbers and their detailed explanations are omitted.

Figure 1:
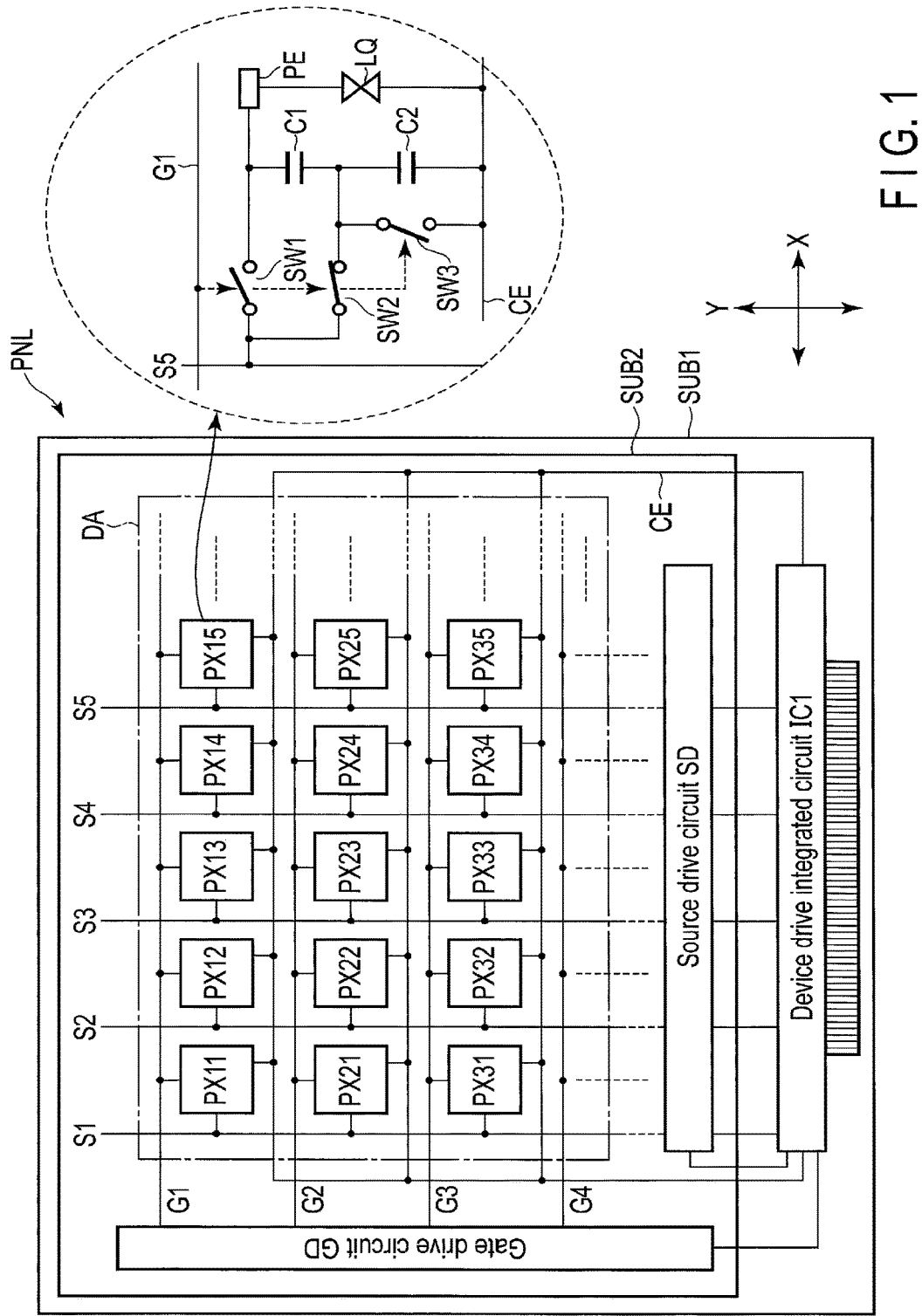
FIG. 1 is a view roughly illustrating the structure of a liquid crystal display panel used for a liquid crystal display in one embodiment, including an illustration of an equivalent circuit of a pixel, a constituent part of the liquid crystal display panel.

The structure of a liquid crystal display panel PNL, which is an active-matrix type and is used for a liquid crystal display of one embodiment, will be explained with reference to FIG. 1 along with an explanation of its equivalent circuit. It should be noted that the main part of the embodiment is not restricted to a liquid crystal display, but that a luminous body using an organic electroluminescent (organic EL) element (also called an organic light-emitting diode [OLED]) may be used for the principal part of the embodiment. FIG. 1 illustrates an exemplary liquid crystal display.

A liquid crystal display panel PNL has a first flatly shaped substrate SUB1, a second flatly shaped substrate SUB2 opposite to the first substrate SUB1, and a liquid crystal layer held between the first substrate SUB1 and the second substrate SUB2. It should be noted that the liquid crystal layer is very thin in comparison with the thickness of the liquid crystal display panel PNL, and that the liquid crystal layer is surrounded with a seal material which bonds the first substrate SUB1 and the second substrate SUB2 together. The second substrate SUB2 has a color filter which is not illustrated.

The liquid crystal display panel PNL has a region where the first substrate SUB1 and the second substrate SUB2 are opposite to each other. This region includes a display area DA for image display. In the illustrated example, the display area DA is formed to have a rectangular shape, and may be sometimes called an active area.

Both a reflective type, which displays an image by selectively reflecting outdoor daylight with pixel electrodes, and a transmission type, which displays an image by selectively transmitting the light from a backlight (not illustrated), may be used for the liquid crystal display panel PNL. As the liquid crystal display panel PNL, there is the display panel PNL which is structured to be suitable for a transverse electric field mode in which a transverse electric field approximately parallel with a substrate main plane is used to drive liquid crystals. Transparent electrodes are used for pixel electrodes of a backlit display panel.

FIG. 1 illustrates an example of a transverse electric field mode liquid crystal display panel PNL which is used in a liquid crystal display having a backlight. As a signal supply source which supplies a signal necessary to drive the liquid crystal display panel PNL, a device drive integrated circuit (which may be called a liquid crystal driver) IC1 is installed in the first substrate SUB1.

The display area DA is included in a region where the liquid crystal layer LQ is held between the first substrate SUB1 and the second substrate SUB2. The display area DA is quadrangular in shape, for example, and is constituted by a plurality of pixels PX's (PX11, PX12, . . . , PX21, PX22, . . . , PX31, PX32, PX33, . . . ), these are forming matrix pattern.

The first substrate SUB1 has at the display area DA a plurality of gate lines G (G1, G2, G3, G4, . . . , Gn) extending along a first axis X and a plurality of source lines S (S1, S2, S3, S4, . . . , Sm) extending along a second axis Y perpendicular, for example, to the first axis X. The first axis X is not limited to intersect in perpendicular with the second axis Y. The X-axis and the Y-axis may just only intersect each other.

Each of the pixels (which may be called pixel circuits) PX is formed as exemplarily illustrated in a circular region which is surrounded by a dotted line and is located on the right-hand side of FIG. 1. The right-hand side view of FIG. 1 illustrates a basic structure of any pixel PX. Therefore, the structure of a pixel PX is not limited to such a structure as illustrated in the right-hand side view of FIG. 1. A pixel PX15 has three switches SW1, SW2 and SW3, and is electrically connected with a gate line G1 and a source line S5. Moreover, the pixel PX15 has a pixel electrode PE, which is electrically connected to the first switch SW1, and a common electrode CE, which is opposite to the pixel electrode PE. Furthermore, the pixel PX15 has a first capacitive element C1 and a second capacitive element C2 which are connected in series with each other to constitute a capacitive element series circuit. The series circuit is electrically connected in parallel with the liquid crystal layer LQ. Since the liquid crystal layer LQ can make a plurality of regions corresponding to the pixels, and since the regions are independently driven, these regions may be called as display elements from the viewpoint of pixels. Moreover, the switches may be called semiconductor switches.

To one terminal for the display element (the liquid crystal layer) LQ, one terminal for the first capacitive element C1 and one terminal for the switch SW1 are connected. To another terminal for the first capacitive element C1, one terminal for the second switch SW2 is connected. It should be noted here that the display element LQ is symbolically illustrated, and that the display element LQ includes capacitance which is between the pixel electrode PE and a corresponding one of the common electrode CE and will be described later. The term of the terminal may be called a node or a connection section.

The aforementioned another terminals for the first switch SW1 and the second switch SW2 are connected to the source line S5. To the aforementioned another terminal for the first switch SW1, one terminal for the second capacitive element C2 is connected, and another terminal of the second capacitive element C2 is connected to the display element LQ.

One terminal of the third switch SW3 is connected to another terminal of the first capacitive element C1, the aforementioned another terminal of the third switch SW3 is connected to the aforementioned another terminal of the display element LQ.

Namely, the capacitive element series circuit comprising the first capacitive element C1 and the second capacitive element C2 (Lwo capacitive elements are illustrated here, but the number of capacitive elements is not restricted to two) is connected in parallel with the display element LQ. In order to boost up electric potential of the capacitive element series circuit comprising capacitive elements C1 and C2, there is provided a boost control circuit having a plurality of switches each being closed or opened by a gate signal during one pulse period of an input source signal (or, alternatively, it may be possible to say the aforementioned one pulse period as one input period, one signal period, one input signal period, one video signal period, or the like). Furthermore, it is not necessary to restrict the embodiment to a case in which only a single gate line gives a gate signal. A boost control circuit may comprise three switches SW1, SW2 and SW3, for example. However, it is not necessary to restrict the number of switches of a boost control circuit to three. The boost control circuit constitutes a boost circuit which increases the electric potential related to the display element LQ. Operation of the boost control circuit will be described later. In this way, each of the pixel circuits is formed in any one of divided regions defined by a plurality of source lines, each guiding a source signal, and a plurality of gate lines, each supplying a gate signal for closing and opening a switch (a semiconductor element).

Each pixel PX is constituted as described above. The gate lines G (G1 to Gn) are drawn out to the outside of the display area DA, and are connected to a gate drive circuit (which may also be called a first drive circuit) GD. The source lines S (S1 to Sm) are drawn out to the outside of the display area DA, and are connected to a source drive circuit (which may also be called a second drive circuit) SD. The gate drive circuit GD and the source drive circuit SD are at least partially formed on the first substrate SUB1, and are connected to the device drive integrated circuit 101.

The source drive circuit SD outputs pixel signals different in polarity from one another to the source lines of the respective adjacent columns in order to accomplish a column inversion driving method.

The device drive integrated circuit IC1 has a built-in controller to control the gate drive circuit GD and the source drive circuit SD, and functions as a signal supply source which supplies a signal necessary to drive the liquid crystal display panel PNL. In the illustrated example, the device drive integrated circuit 101 is installed on the first substrate SUB1 to be located outside the display area DA of the liquid crystal display panel PNL.

The device drive integrated circuit IC1 has a timing pulse generating section, which generates various timing pulses, and gives the generated various timing pulses to the gate drive circuit GD and the source drive circuit SD. Moreover, the device drive integrated circuit IC1 has a power supply circuit, a booster circuit, etc., inside of it in order that various power supply voltages may be produced and output. Accordingly, the source lines S, the gate lines G, and the common electrode branches of the common electrode CE are dependent in terms of electric potential on various kinds of voltages generated by the device drive integrated circuit IC1.

The common electrode CE extends over the entire display area DA, and is common to the pixels PX. The common electrode CE is drawn out of the display area DA and is connected to, for example, an electric supply section which is in the device drive integrated circuit IC1. It should be noted that the common electrode CE is made of transparent conductive materials such as indium tin oxide (ITO) or indium zinc oxide (IZO).

FIGS. 2A and 2B each illustrate how an exemplary pixel of this embodiment will operate. Suppose that a pulsed gate signal is applied to gate line G1 when the pulsed signal is at a high level (positive polarity gate voltage), and that a write signal is applied to source line S5 in synchronization with the gate signal. Then, the positive polarity gate voltage causes the first switch SW1 and the third switch SW3 to close whereas the second switch SW2 to open. Therefore, the first switch SW1 causes the write signal applied to source line S5 to flow to capacitive element C1 and the display element LQ. Now, suppose that the write signal (video signal) is 6.5V, and that the common electrode CE has a voltage of 5.0V. Then, the voltage of 1.5V is given between one terminal and another terminal for the display element LQ. Moreover, since the third switch SW3 is in an on state, the voltage of the common electrode CE, which is 5.0V, is also applied to the junction point (node N) of capacitive element C1 and capacitive element C2.

In this embodiment, the first switch SW1, the second switch SW2, and the third switch SW3 are individually made of, for example, an N-channel transistor (thin-film transistor [TFT]). Here, it should be noted that the first switch SW1 and the third switch SW3 must be simultaneously closed whereas the second switch SW2 must be opened whenever the first switch SW1 and the third switch SW3 are closed, and that all the transistors are controlled by the gate signal from the same gate line G1. To satisfy these requirements, there is provided an inverter INV to supply the gate signal to the gate of transistor SW2 in this embodiment.

Let us suppose here that the gate signal changes to a negative gate voltage while the write signal (video signal) is 6.5V. Then, the first switch SW1 and the third switch SW3 are opened, whereas the second switch SW2 is closed (the state of FIG. 2B). Thereby, 6.5V is applied through the second switch SW2 to the junction point (node N) of capacitive elements C1 and C2. Since a voltage of 6.5V is applied to the node N which carries a voltage of 5.0V, the difference 1.5V will be distributed between capacitive element C1 and display element LQ. When capacitive element C1 and display element LQ are almost equal in capacitance, a voltage of 0.75V may be applied to capacitive element C1 and a voltage of 0.75V may be applied to display element LQ. Accordingly, the terminal at the other side of capacitive element C1, that is, that one of the terminals of capacitive element C1 that is connected to the display element LQ is pushed (boosted) up to 6.5V+0.75V=7.25V. Next, switch SW2 is opened. Accordingly, a positive polarity voltage of 2.25V, which is the result of a boost of 0.75V caused by an externally applied voltage of 1.5V, is applied to the display element LQ, which is one of the divided separate regions of the liquid crystal layer. In other words, the voltage of 2.25V is applied between the common electrode CE and the pixel electrode.

Accordingly, a drive voltage of a sufficient level will be applied to the display element LQ. That is, even if the output voltage for a pixel drive output from the device drive integrated circuit IC1 is lower than any of the conventional output voltages, a display element will be driven by a sufficiently large drive voltage.

Figure 2C:
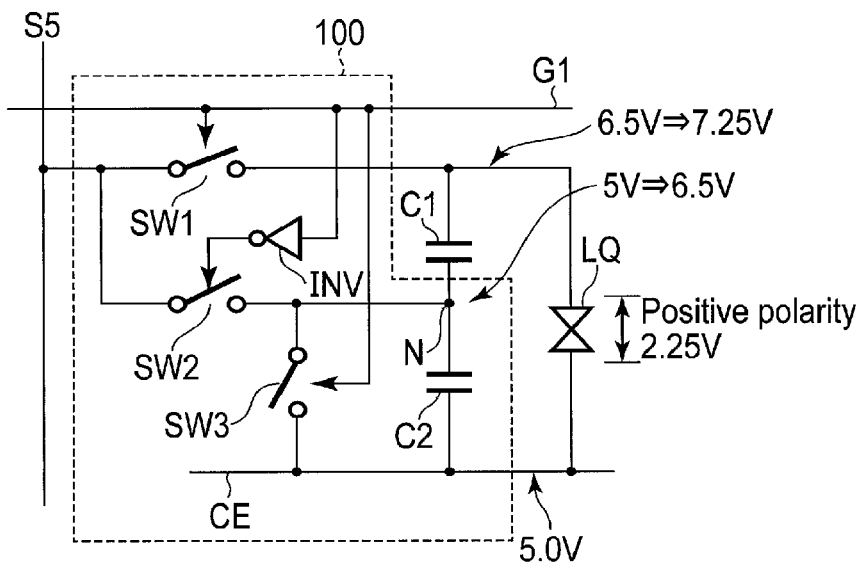
FIG. 2C illustrates the pixel circuit of the embodiment, and is a view specifically illustrating the basic structure of the pixel circuit for explaining a display (voltage holding) state, a third step of the positive polarity operation, into which the pixel circuit is brought.
Figure 3B:
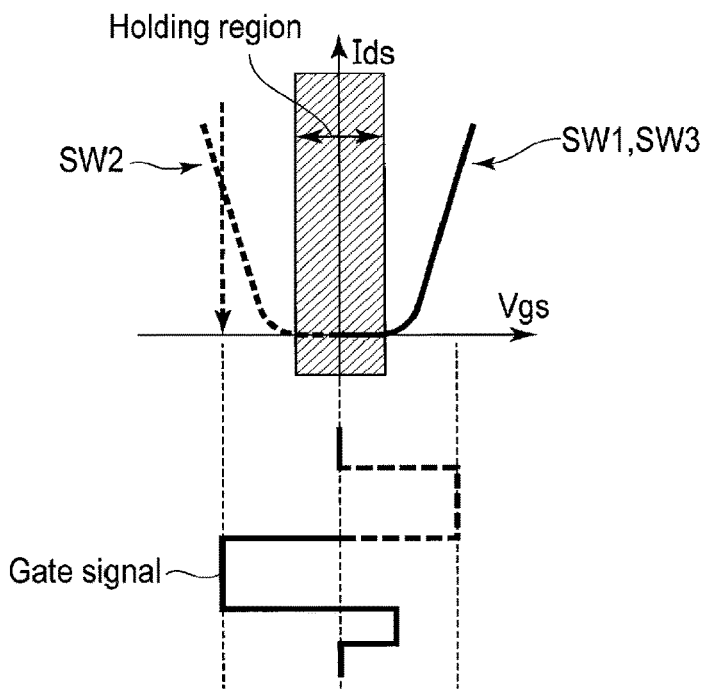
FIG. 3B is an operating characteristic view explanatorily illustrating an exemplary second operational step which the pixel circuit of the embodiment performs.

FIG. 2C illustrates a state where the gate signal temporarily changes to a positive polarity, and the second switch SW2 is kept open. In this state, the electric potential applied to the display element LQ will be kept unchanged. It should be noted that a wave-like gate signal, which temporarily changes to a positive polarity as illustrated in FIG. 3B, may not be required according to the switching characteristic of each semiconductor device. Furthermore, it is possible according to the switching characteristic of each semiconductor device to open all switches SW1, SW2, and SW3 without temporarily changing a gate signal to a positive polarity.

Figure 2D:
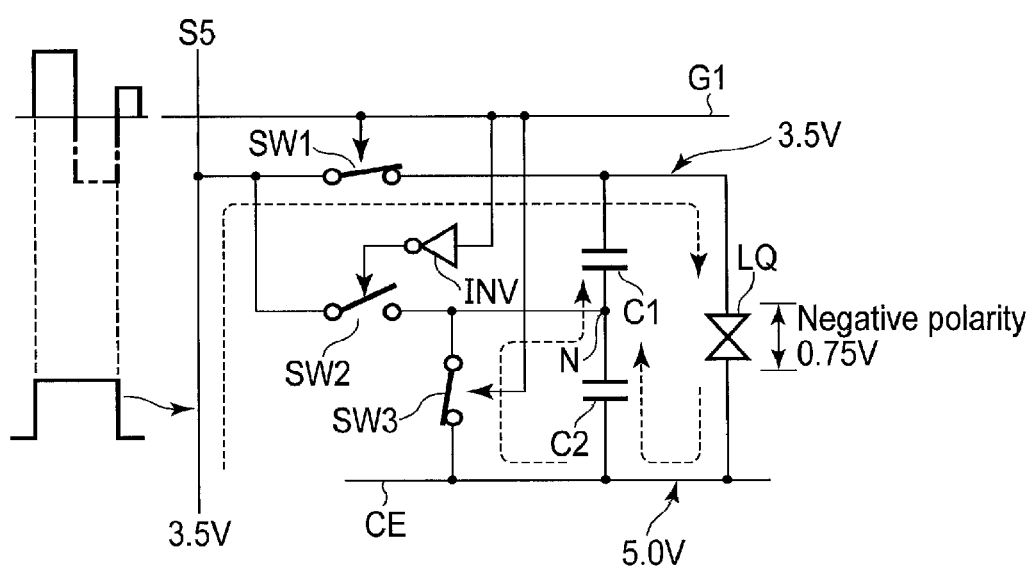
FIG. 2D illustrates the pixel circuit of the embodiment, and is a view specifically illustrating the basic structure of the pixel circuit for explaining a first step of a negative polarity operation into which the pixel circuit is brought.

The above mentioned circuit is driven in the next frame so that the relation of polarity of the display element LQ is reversed. Accordingly, a write signal (a video signal) of 3.5V is input into source line S5 (that is, a signal line) in a state where switches SW1 and SW3 are closed whereas switch SW2 is opened, as illustrated in FIG. 2D, in the next frame. Since the pixel electrode has a voltage of 3.5V and the common electrode CE has a voltage of 5.0V, the difference voltage of 1.5V is applied to the parallel circuit of capacitive element C1 and display element LQ at this time. Since capacitive element C1 and display element LQ are almost equal in capacitance, the difference voltage 1.5V is equally divided between capacitive element C1 (0.75V) and display element LQ (0.75V).

Subsequently, switch SW1 and switch SW3 are opened, and switch SW2 is closed, as illustrated in FIG. 2E. Then, the pixel voltage is boosted. That is, the potential of the junction point (node N) of capacitive element C1 and capacitive element C2 changes from 5.0 to 3.5V. Where the potential difference across capacitive element C1 is 0.75V. Thus, the electric potential of the junction point of capacitive element C1 and the pixel electrode of the display element LQ becomes (3.5V−0.75V)=2.75V. Then, switch SW2 opens, and it will be in a holding state. Then, the potential difference (5.0V−2.75V=2.25V) between the common electrode CE and the pixel electrode is applied to the display element LQ. As the result, voltage of 2.25V that is the negative polarity against FIG. 2C, is applied to the display element LQ.

FIG. 3A and FIG. 3B illustrate an exemplary operating or performance characteristic of a circuit which includes an inverter INV and a first switch to a third switch SW1, SW2 and SW3. In the operating characteristic, a gate voltage (a gate-source voltage) Vgs is horizontally illustrated, and a current Ids which flows across a switch to be controlled (a source-drain current) is vertically illustrated. If the display element LQ is an organic EL device, there may be provided a built-in circuit which temporarily holds the write signal supplied from a signal line. And the signal from the built-in circuit may be increased by a boost circuit.

When a gate voltage falls within a specific range (±v1) (this range is called a holding region), the first to third switches SW1, SW2, and SW3 maintain their respective states. When the gate voltage falls into a region greater than +v1, the first switch SW1 and the third switch SW3 close and the second switch SW2 opens. When the gate voltage falls into a region less than −v1, the second switch SW2 closes and the first switch SW1 and the third switch SW3 open.

In the embodiment explained above, all the semiconductor devices that constitute the first to third switches SW1, SW2, and SW3 belong to the same channel type (for instance, an N-channel type). However, the present invention is not at all restricted to this embodiment alone. For example, it is possible that the semiconductor devices which constitute the first and third switches SW1 and SW2 are an N-channel type, and that the semiconductor device which constitutes the second switch SW2 is a P-channel type.

Figure 4A:
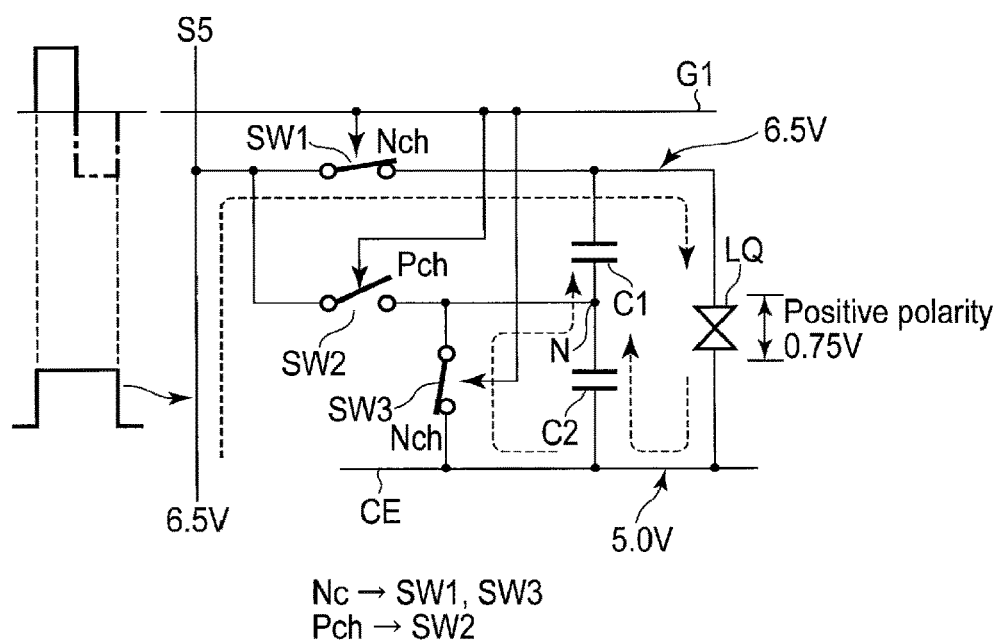
FIG. 4A illustrates a pixel circuit in another embodiment, and is a view specifically illustrating the basic structure of the pixel circuit for explaining a first step of a positive polarity operation which the pixel circuit performs.

FIG. 4A illustrates an example in which the first and third switches SW1 and SW3 each comprise an N-channel transistor, and the second switch SW2 comprises a P-channel transistor. The circuit configuration of FIG. 4A achieves removal of the inverter INV illustrated in FIG. 2A, which makes the structure illustrated in FIG. 4A greatly different from the structure illustrated in FIG. 2A. This embodiment does not require any inverters. Therefore, this embodiment makes it possible to enlarge an open area ratio of a pixel region in comparison with the earlier embodiment.

Figure 4B:
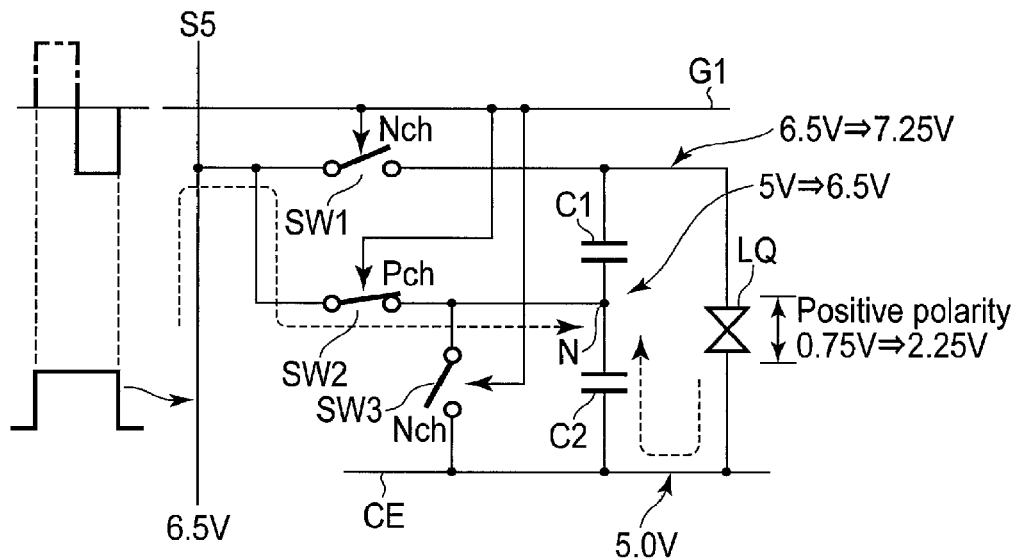
FIG. 4B illustrates the pixel circuit of the embodiment, and is a view specifically illustrating the basic structure of the pixel circuit for explaining a second step of the positive polarity operation which the pixel circuit performs.

FIG. 4A and FIG. 4B illustrate a switching operation which causes a pixel circuit of the embodiment to perform a positive polarity operation. As illustrated in FIG. 4A, when a gate signal having a positive polarity is supplied to switches SW1 and SW3, switches SW1 and SW3 close, and the image (pixel) signal of 6.5V from source line S5 is given to each of one terminals for the display element LQ and capacitive element C1 through switch SW1. At this moment, the voltage of 5.0V is applied to the aforementioned another terminal of the capacitive element C1, from the common electrode CE through the third switch SW3. Accordingly, a potential difference of 1.5V will be obtained because of the difference between the voltage of 6.5V and the voltage of 5.0V, and is distributed between capacitive element C1 and display element LQ. Capacitive element C1 and display element LQ are designed to be almost equal to each other in capacitance. Accordingly, the voltage of 1.5V will be distributed in such a manner that the voltage between terminals for capacitive element C1 itself may be 0.75V and the voltage between terminals for display element LQ itself may be 0.75V.

Subsequently, when the gate signal changes to a negative polarity, as illustrated in FIG. 4B, the first switch SW1 and the third switch SW3 open, and the second switch SW2 closes. Therefore, voltage of the other side terminal for the capacitive element C1, that is the voltage at the node N, changes from 5.0 to 6.5V. And the electric potential of the one terminal for capacitive element C1 changes from 6.5V to (6.5V+0.75V)=7.25V. Subsequently, switch SW2 opens. As a result, the voltage between the terminals for the display element LQ (voltage between the common electrode CE and the pixel electrode) changes from 1.5 to 2.25V. Accordingly, a drive voltage for the display element LQ becomes a sufficient level. That is, even if the output voltage for a pixel drive output from the device drive integrated circuit IC1 is lower than any of the conventional output voltages, a display element will be driven by a sufficiently large drive voltage.

Figure 4C:
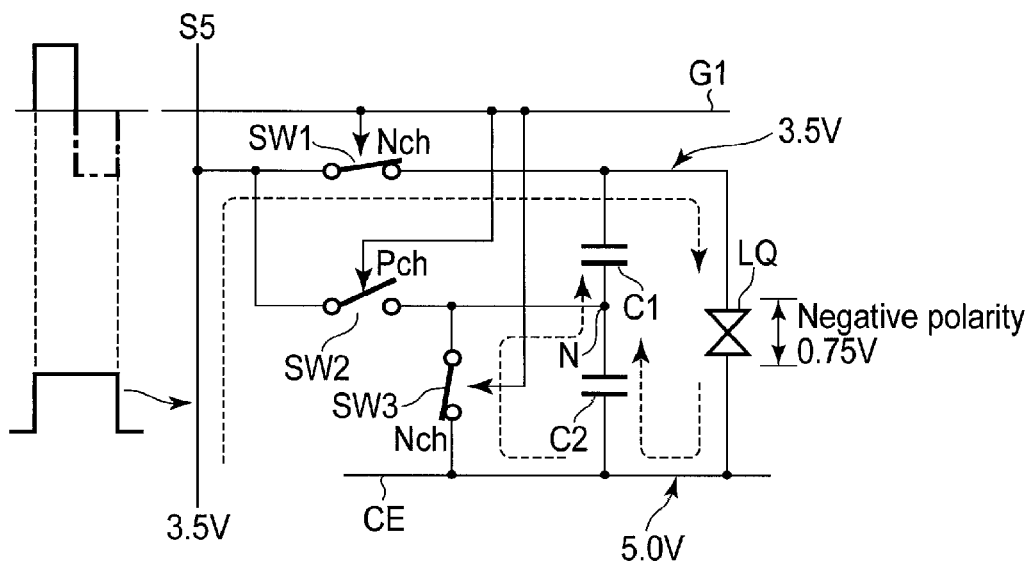
FIG. 4C illustrates the pixel circuit of the embodiment, and is a view specifically illustrating the basic structure of the pixel circuit for explaining a first step of a negative polarity operation which the pixel circuit performs.

The above mentioned circuit is driven in the next frame under the condition that the display element LQ is reversed in polarity. Accordingly, a write signal (a video signal) of 3.5V is input into source line S5 in a state where switches SW1 and SW3 are closed whereas switch SW2 is opened, as illustrated in FIG. 4C, in the next frame. Since the pixel electrode has a voltage of 3.5V and the common electrode has a voltage of 5.0V, the difference voltage of 1.5V is applied to the circuit of capacitive element C1 and display element LQ at this time. Since capacitive element C1 and display element LQ are almost equal in capacitance, the difference voltage 1.5V is equally divided between capacitive element C1 (0.75V) and display element LQ (0.75V).

Figure 4D:
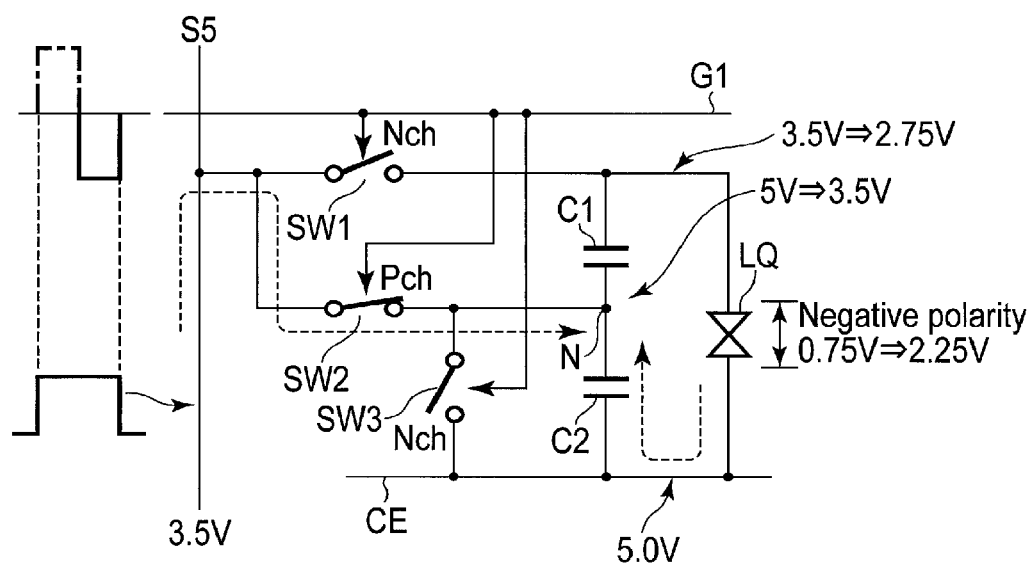
FIG. 4D illustrates the pixel circuit of the embodiment, and is a view specifically illustrating the basic structure of the pixel circuit for explaining a second step of the negative polarity operation which the pixel circuit performs.

Subsequently, switches SW1 and SW3 are opened and switch SW2 is closed, as illustrated in FIG. 4D. Then, the pixel voltage is boosted. That is, the electric potential at the junction point (node N) of capacitive element C1 and capacitive element C2 changes from 5.0 to 3.5V. Where capacitive element C1 and display element LQ are almost equal in capacitance. Therefore, the potential difference (1.5V) between the voltage (3.5V) at the node N and the voltage (5.0V) at the electrode system CE is equally allocated between capacitive element C1 and display element LQ, namely, 0.75V each. This means that the potential difference between terminals for capacitive element C1 is 0.75V. Therefore, the electric potential at the junction point of capacitive element C1 and the pixel electrode of the display element LQ will be (3.5V−0.75V)=2.75V after all. As a result, the potential difference (5.0V−2.75V=2.25V) generated between the pixel electrode and the common electrode CE will be applied to the display element LQ. The voltage of 2.25V which has negative or positive polarity will be applied to the display element LQ, which is one of the divided separate regions of the liquid crystal layer.

Figure 5:
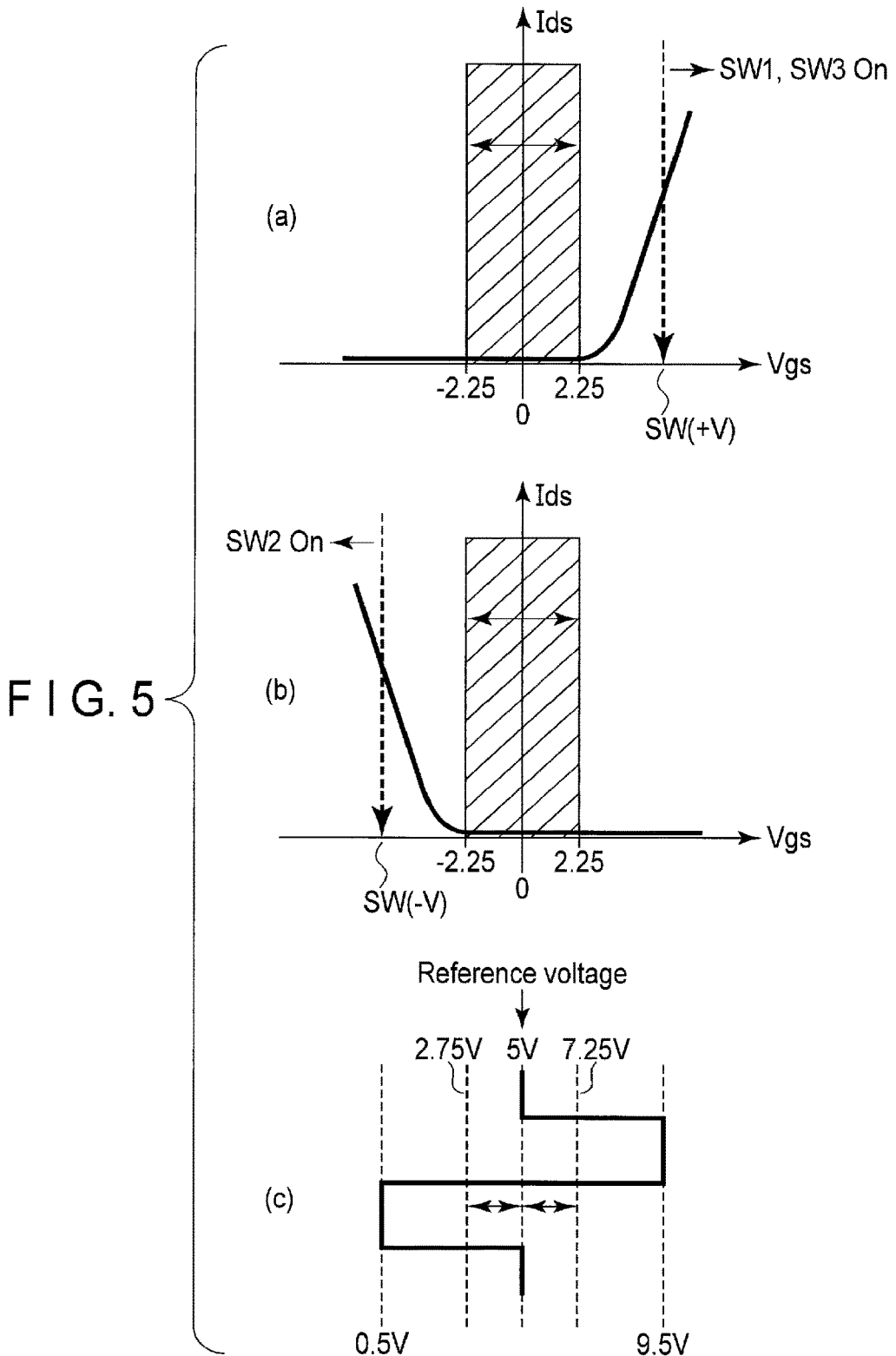
FIG. 5 comprises two views each illustrating semiconductor switching characteristics and a view illustrating an exemplary driving signal (gate signal), all the views presented to explain how to make the pixel circuit operate as illustrated in FIGS. 4A to 4D.

FIG. 5 illustrates (at (a) of FIG. 5) the operating characteristic of the first switch SW1 and the third switch SW3, each comprising an N-channel transistor and used in the embodiment illustrated in FIG. 4A to FIG. 4D, and (at (b) of FIG. 5) the operating characteristic of the second switch SW2 that comprises a P-channel transistor and is used in the embodiment illustrated in FIG. 4A to FIG. 4D. Moreover, (c) of FIG. 5 illustrates an exemplary gate signal which performs close/open control of each of the first to third switches SW1 to SW3. In (a) and (b) of FIG. 5, a drain-source current which flows through a semiconductor device is horizontally illustrated, and a gate-source voltage which flows through the semiconductor device is vertically illustrated.

What is illustrated in (a) of FIG. 5 is an exemplary switching voltage SW(+V) of an N-channel semiconductor device (switches SW1, SW3). The range from +2.25V to −2.25V is the range of the voltage of a video signal (voltage of LQ). The switching voltage SW(+V) (a point of a voltage to switch between closed and open) must be deep (or greater) than +2.25V. The threshold voltage Vth of each of switches SW1 and SW3 is 2.25V. Therefore, the switching voltage SW(+V) is set to SW(+V)=video signal(2.25V)+2.25V=4.5V.

On the other hand, as illustrated in (b) of FIG. 5, the threshold voltage Vth of the P-channel semiconductor device (switch SW2) is −2.25V. The voltage of the video signal of negative polarity is −2.25V. Therefore, the switching voltage SW(−V) of the P-channel semiconductor device (switch SW2) is set to SW(−V)=video signal(−2.25V)+(−2.25V)=−4.5V.

The switching voltage of the above-mentioned gate signal is obtained on the assumption that the reference voltage is 0. However, as illustrated in FIG. 4A to FIG. 4D, the pixel circuit operates using the voltage (5.0V) of the common electrode CE as a reference voltage. Accordingly, the switching voltage of an actual gate signal may change as illustrated in (c) of FIG. 5.

That is, when each of switches SW1 and SW3 consists of an N-channel transistor, and when 5.0V is used as a reference voltage, a positive side voltage of at least 7.25V (=5.0V+2.25V)+Vth(2.25V)=9.5V is required as a switching voltage.

In contrast, when switch SW2 consists of a P-channel transistor, and when 5.0V is used as a reference voltage, a negative side voltage of not more than 2.75V(=5.0V−2.25V)+(−Vth[=−2.25V])=0.5V is required as a switching voltage.

The respective switching voltages are set as mentioned above, if the voltage of a gate signal falls within the range between 0.5 and 9.5V in the state, all switches SW1, SW2, and SW3 will be kept open. In the case of actually keeping switches SW1, SW2, and SW3 open, it may be preferable that the gate voltage should be kept at 5.0V, as described above.

As described above, it is necessary to make large the threshold voltage Vth of each of switches SW1, SW2, and SW3 to successfully open all switches SW1, SW2, and SW3. Adjustment of a semiconductor device in threshold voltage Vth may be performed by the threshold control (Vth control) in a manufacturing process. It may be effective to make the threshold voltage Vth as deep (or large) as possible when manufacturing each of switches SW1, SW2, and SW3 for achievement of a stable switching operation even if an opening voltage for opening all switches SW1, SW2, and SW3 may fluctuate. A sufficiently large threshold voltage Vth allows some fluctuation or variation of the voltage 5.0V of a common electrode. Therefore, a stable operation of a pixel circuit will be guaranteed.

It should be noted that there may be a case where either P- or N-channel semiconductor devices alone may be subjected to the Vth control in the manufacturing process of the above-mentioned semiconductor devices. In such a case, what is necessary is just to set a reference voltage to a midway point between the Vth of each P-channel semiconductor device and the Vth of each N-channel semiconductor device.

This invention is not restricted to the above-mentioned embodiment. In the above-mentioned embodiment, the gate signal which closes and opens each of switches SW1, SW2, and SW3 is input from single gate line G1 to the control terminal of each switch. However, two gate lines may be used.

Figure 6A:
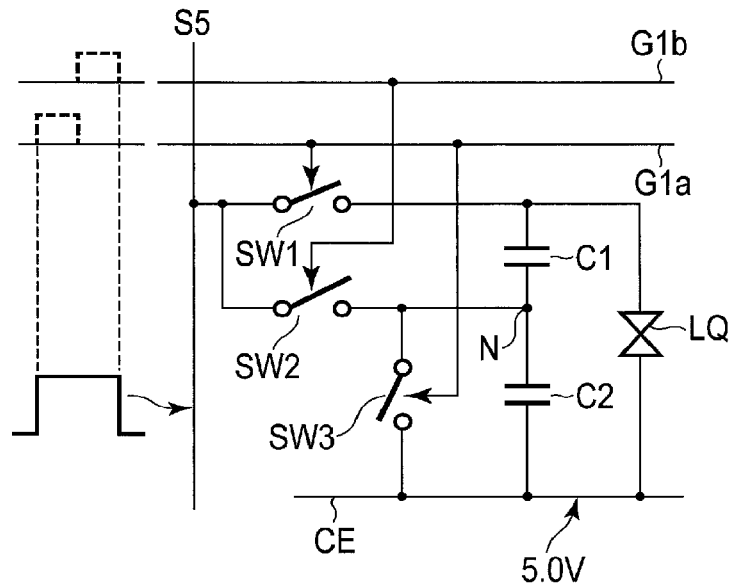
FIG. 6A is a view illustrating a pixel circuit in still another embodiment.

FIG. 6A illustrates a pixel circuit in another embodiment. In this embodiment, a first switch to a third switch SW1, SW2, and SW3 are all made of the same channel (for example, N-channel) semiconductor devices. And the first and third switches SW1 and SW3 are close/open controlled by a gate signal from a gate line G1a. The second switch SW2 is close/open controlled by a gate signal from a gate line G1b. Other composition is composition similar to the above embodiment.

In a positive polarity operation, switches SW1 and SW3 are closed by the gate signal from gate line G1a. Then, the write signal (video signal) of 6.5V is supplied from a signal line S5 to a pixel electrode which a display element LQ has. Accordingly, the pixel electrode of the display element LQ is set to 6.5V, and a node N, which is a junction point of two capacitive elements C1 and C2, is set to 5.0V. And the voltage of 0.75V is allocated to each of capacitive element C1 and display element LQ. Subsequently, switches SW1 and SW3 open, whereas switch SW2 closes with the gate signal from gate line G1b. Then, the write signal of 6.5V is supplied from the signal line S5 to the node N. This makes the electric potential of the pixel electrode of the display element LQ rise from 6.5 to 7.25V. Subsequently, switch SW2 opens. Then, the voltage across the display element LQ will rise from 0.75V to 2.25V, and will become an adequate liquid crystal drive voltage. This operation is similar to the positive polarity operation explained with reference to FIG. 2A and FIG. 2B.

Since a negative polarity operation is almost the same as the operation explained with reference to FIG. 2C and FIG. 2D, its detailed explanation is omitted.

Figure 6B:
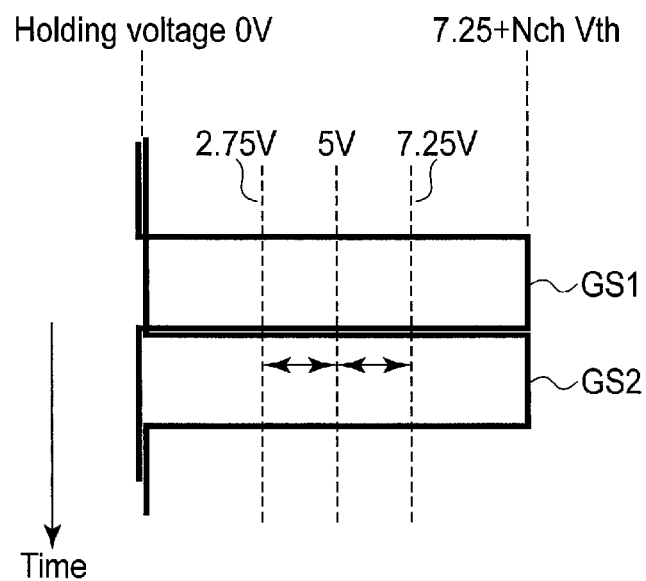
FIG. 6B is a view illustrating an exemplary gate signal for explaining how to operate the pixel circuit of FIG. 6A.

FIG. 6B illustrates an exemplary gate signal GS1 which performs close/open control of the operation of each of switches SW1 and SW3, each constituted by an N-channel semiconductor device, and an exemplary gate signal GS2 which performs close/open control of the operation of switch SW2 constituted by an N-channel semiconductor device. Since the positive polarity operation and negative polarity operation of this pixel circuit are almost the same as the respective operations explained with reference to FIG. 2A to FIG. 2D, their detailed explanation is omitted.

As is apparent from the above, the embodiments are able to characteristically function as a display device control method. That is, the embodiments belong to a display device control method that boosts up a holding voltage by changing a gate pulse between positive polarity and negative polarity during a period while an image signal is applied to the signal line. When a gate pulse is in a positive polarity state, a boost control circuit applies an image signal to a first part which a capacitance circuit has, and keeps the holding voltage in a first level. When the gate pulse is negative, the boost control circuit applies the image signal to a second part which the capacitance circuit has, and boosts the holding voltage from the first level to a second level.

Figure 7:
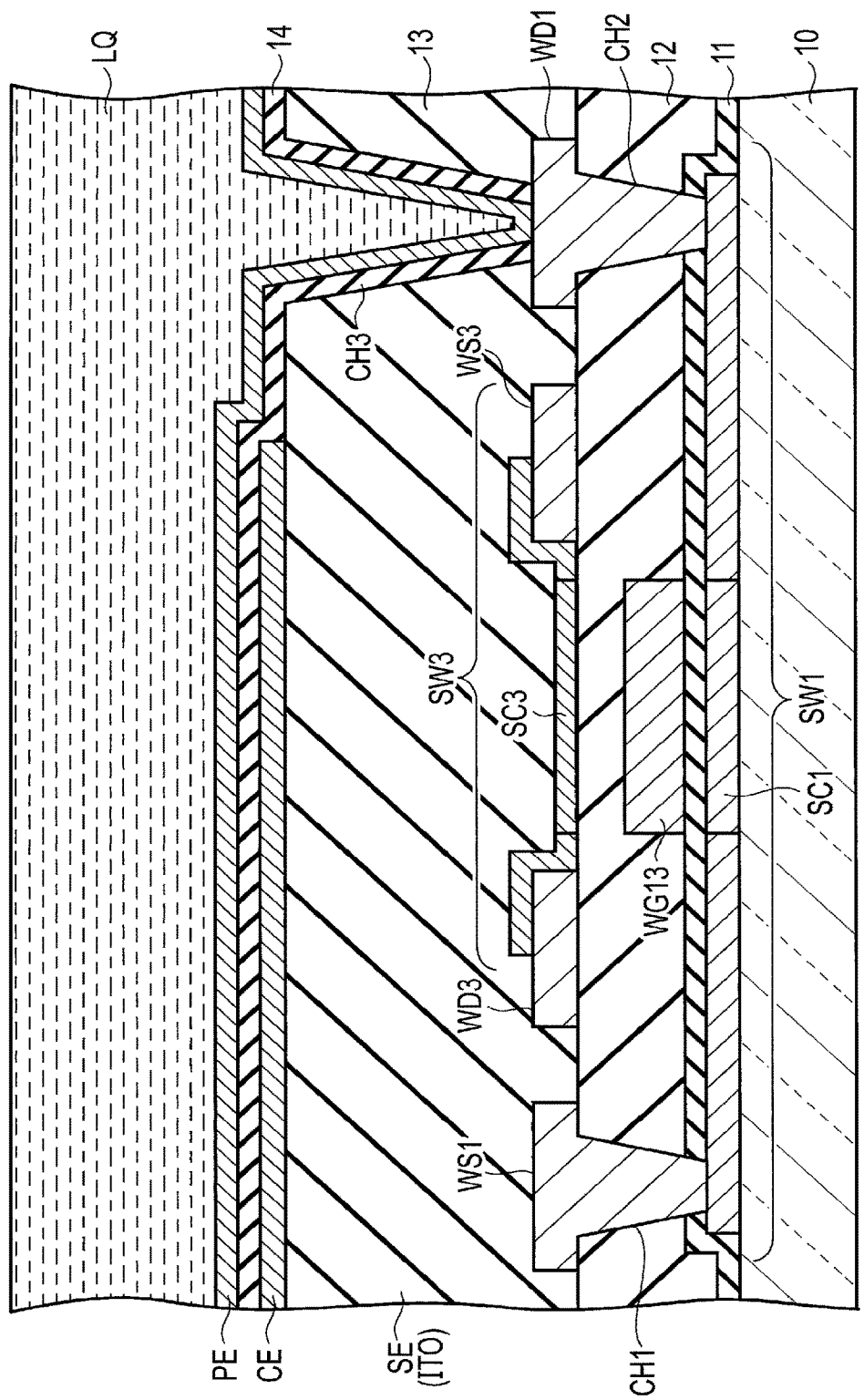
FIG. 7 is a schematic sectional view structurally illustrating a first switch SW1 and a third switch SW3, each made of a corresponding one of the semiconductor elements formed in the first substrate SUB1 in the embodiment of FIG. 4A.

FIG. 7 is a view illustrating an exemplary structure of a first switch SW1 and an exemplary structure of a third switch SW3, each made of semiconductors formed in the first substrate SUB1. It should be noted that actual insulating layers, actual metal layers, actual glass substrates, actual traces, etc., are different in relative thickness or length from those illustrated in the drawing for the sake of making the structures easily understood.

Number 10 denotes a first insulating substrate made of glass etc. A semiconductor layer SC1 which (is an N-channel type and) constitutes a first switch SW1 is formed on the first insulating substrate 10, and is covered with a first insulating layer 11. Moreover, the first insulating layer 11 also covers the first insulating substrate 10. The first insulating layer 11 is an inorganic material, such as silicon oxide or nitric oxide, for example.

The first switch SW1 has a gate electrode WG13, which is formed on the first insulating layer 11, and is located just above the semiconductor layer SC1. Gate electrode WG13 is electrically connected to a corresponding one of gate lines G (or is formed in one piece with a corresponding one of the gate lines G), and is covered with a second insulating layer 12. The second insulating layer 12 also covers the first insulating layer 11. The second insulating layer 12 is an inorganic material, such as silicon nitride, for example.

The first switch SW1 has a source electrode WS1 and a drain electrode WD1, both formed on the second insulating layer 12. Moreover, a corresponding source line S (not illustrated in the drawing) is formed on the second insulating layer 12 in a similar manner. Source electrode WS1 is electrically connected to the source line S (or formed in one piece with the source line S). Source electrode WS1 and drain electrode WD1 are in contact with the semiconductor layer SC1 via respective contact holes CH1 and CH2, each of which extends through both the first insulating layer 11 and the second insulating layer 12 to the semiconductor layer SC1.

Furthermore, a semiconductor layer SC3 which (is an N-channel type and) constitutes the third switch SW3 is formed on the second insulating layer 12 and is located right above gate electrode WG13. The third switch SW3 which includes the semiconductor layer SC3 has a source electrode WS3 and a drain electrode WD3, each of which is also formed on the second insulating layer 12. The third switch SW3 is covered with a third insulating layer 13. The third insulating layer 13 also covers the second insulating layer 12. The third insulating layer 13 is a transparent resin material.

The first switch SW1 and the third switch SW3 hold gate electrode WG13 in common. The first switch SW1 has gate electrode WG13 in the upper part of the semiconductor layers. Accordingly, it is called a top-gate type. In contrast, the third switch SW3 has the gate electrode in the lower part of the semiconductor layers. Accordingly, it is called a bottom-gate type. The first switch SW1 and the third switch SW3 are in phase, and are simultaneously closed and opened according to a gate voltage. They each consist of an N-channel semiconductor device, for example.

FIG. 7 illustrates that the first switch SW1 is a top-gate type, and the third switch SW3 is a bottom-gate type. However, it is possible to make this relation converse. Namely, it is possible that the third switch SW3 may be a top-gate type, and that the first switch SW1 may be a bottom-gate type. It should be noted that the structure illustrated in FIG. 7 makes it possible for the first switch SW1 (top-gate transistor) and the third switch SW3 (bottom-gate transistor) to jointly use a single gate electrode. This fact also makes it possible to establish a dual-transistor structure, in which a lengthwise extending channel portion which a top-gate transistor has may be at least partially coincide with a lengthwise extending channel portion which a bottom-gate transistor has as apparent from the cross-section of FIG. 7.

Furthermore, such a dual-transistor structure makes it possible that switch SW1 is formed at an earlier process using polysilicon, and then switch SW3 is formed at a next process using a transparent amorphous oxide semiconductor (TAOS). TAOS may be easily formed at a much lower temperature than polysilicon. Therefore, it is effective to use TAOS.

The third insulating layer 13 has an upper surface where a common electrode CE is formed. It should be noted that this embodiment has been hitherto explained as the liquid crystal layer LQ is above the first substrate SUB1. The common electrode CE extends from pixel to pixel, and covers the source lines of the respective pixels. The common electrode CE is made of a transparent conductive material such as indium tin oxide (ITO) or indium zinc oxide (IZO), for example. The common electrode CE extends to a non-displaying area, which the first substrate SUE1 has, as illustrated in FIG. 1, and is connected to a common electric potential feed section. A fourth insulating layer 14 covers the common electrode CE.

A contact hole CH3 is formed to extend through both the third insulating layer 13 and the fourth insulating layer 14 to drain electrode WD1 of the first switch SW1. The fourth insulating layer 14 is much thinner than the third insulating layer 13, and is an inorganic material such as silicon nitride, for example. The fourth insulating layer 14 is equivalent to an insulation layer between layers, and covers the common electrode CE.

A pixel electrode PE which has slits is formed on the fourth insulating layer 14, and is located opposite to the common electrode CE. The pixel electrode PE is electrically connected through the contact hole CH3 to drain electrode WD1 of the first switch SW1. The pixel electrode PE is made of a transparent conductive material such as ITO or IZO, for example. The pixel electrode PE is covered with a first horizontally orientated layer (not illustrated). The present embodiment uses a fringe field switching (FFS) system, in which a pixel electrode PE having slits is used for driving liquid crystal elements of a liquid crystal layer LQ, by the pixel electrode PE and the common electrode system CE.

The second switch SW2 is not illustrated in FIG. 7. The second switch SW2 is formed at a different part from the first switch SW1 and the third switch SW3.

Figure 8:
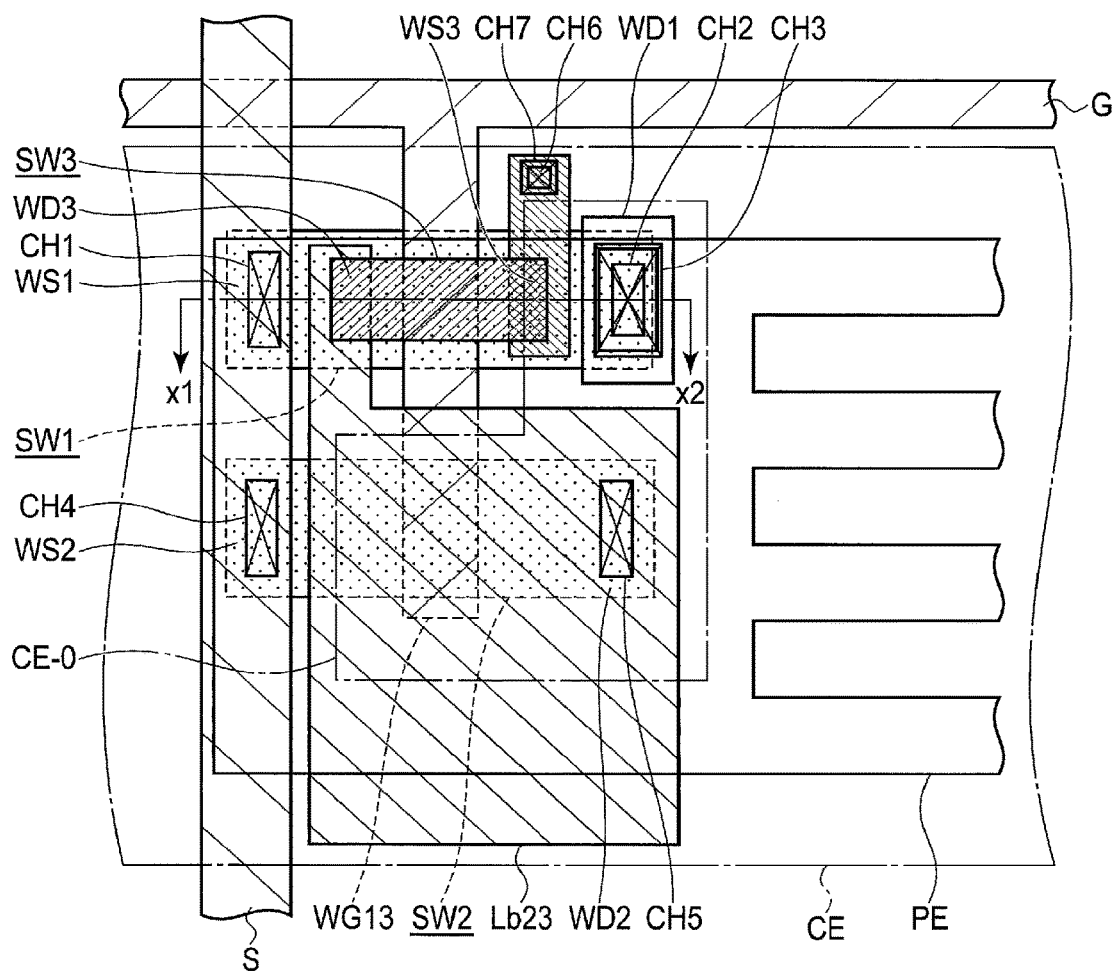
FIG. 8 is a plan view of the exemplary structure illustrated in FIG. 7, and schematically illustrates, as seen from above, an arrangement of the first switch SW1, a second switch SW2, and the third switch SW3.

FIG. 8 is a plan view clearly illustrating a position where the second switch SW2 is formed. What is illustrated in FIG. 7 is a cross-section taken along line x1-x2 illustrated in FIG. 8. It is apparent from FIG. 8 that source electrode WS1 of the first switch SW1 is connected to the source line S, and that drain electrode WD1 of the first switch SW1 is connected through the contact hole CH3 to the pixel electrode PE. It is also apparent from the plan view that the third switch SW3 is arranged in such a manner that it may partially overlap with the first switch SW1.

Drain electrode WD3 of the third switch SW3 is connected through a multifunctional electrode Lb23 to a drain electrode WD2 which the second switch SW2 has. The second switch SW2 is formed in the same layer as the first switch SW1, and is arranged in parallel with the first switch SW1. Accordingly, the multifunctional electrode Lb23 is connected through a contact hole CH5 to drain electrode WD2 of the second switch SW2. The second switch SW2 has a source electrode WS2 which is connected through the contact hole CH4 to the source line S similarly to the first switch SW1 of FIG. 7. The second switch SW2 shares gate electrode WG13 with the first switch SW1 and the third switch SW3. The second switch SW2 has gate electrode WG13 as a top gate. Furthermore, the shape of the common electrode CE does not need to have a pattern illustrated in FIG. 8, but may have various kinds of patterns. The same thing can also be said in the following explanation, and the common electrode CE should just form a circuit illustrated in FIG. 2A or FIG. 2B. It is preferable that the multifunctional electrode Lb23 is a transparent electrode. The multifunctional electrode Lb23 has (1) a function of electrically connecting the drain electrode of the second switch SW2 and the drain electrode of the third switch SW3, (2) a function of forming capacitive element C1 along with the pixel electrode CE through an opening CE-O provided in the common electrode CE, and (3) a function of forming capacitive element C2 which is opposite the common electrode CE.

In the above-mentioned embodiment, the multifunctional electrode Lb23 and the common electrode CE form a characteristic shape and pattern. The common electrode CE has a section which is opposite to and overlaps with the multifunctional electrode Lb23. And at least the section has an opening CE-O. In due to an existing of the opening CE-O, the multifunctional electrode Lb23 includes a portion (one of a first portion and a second portion) which is opposite to and overlaps with the pixel electrode PE. The portion forms capacitive element C1, which has been previously explained, along with the pixel electrode PE. Furthermore, the multifunctional electrode Lb23 has another portion (the other of the first portion and the second portion) which is opposite to and overlaps with the common electrode CE. This portion forms capacitive element C2, which has been previously explained, along with the common electrode CE.

In order to determine an amount of capacitance for each of capacitive element C1 and capacitive element C2, both having been structured as described above, an area of the multifunctional electrode Lb23 and/or an area of the opening CE-O of the common electrode CE is adjusted. Alternatively, it may be controlled thickness of some regions of the third insulating layer 13 being become thin, at a manufacturing process, where capacitive elements C1 and C2 are formed at the regions. Namely, it is possible to control the thickness of the insulating layer 13 in the manufacturing process in order to have a sufficient amount of capacitance for each of capacitive elements C1 and C2.

Either an N- or a P-channel transistor may be used for the above-mentioned second switch SW2. However, the second switch SW2 needs to operate in opposite phase to both the first switch SW1 and the third switch SW3. Consequently, when the first switch SW1, the third switch SW3, and the second switch SW2 are all N-channel transistors, for example, then the gate signal applied to gate electrode WG2 of the second switch SW2 needs to be opposite in phase to the gate signal applied to each of gate electrode WG1 of the first switch SW1 and gate electrode WG3 of the third switch SW3.

Accordingly, if the gate signal is directly supplied from a single gate line G to each of gate electrode WG1 of the first switch SW1, and gate electrode WG3 of the third switch SW3, the gate signal which flows from the gate line G into gate electrode WG2 of the second switch SW2 needs to have passed through the inverter INV, as has been explained with reference to FIG. 2A to FIG. 2D, for example.

It should be noted here that the application of the following measure will eliminate the need for an inverter in a case where the first switch SW1 and the third switch SW3, which operate simultaneously with each other, are each made of either one of an N-channel (Nch) transistor and a P-channel (Pch) transistor, and if the second switch SW2, which operates differently in timing from the two switches SW1 and SW3, consists of the other of the Nch transistor and the Pch transistor. Namely, when the transistors are made in the manufacturing process, the transistors are adjusted in their respective threshold voltages Vth in such a manner that the voltage difference between the threshold voltage Vth of the Pch transistor and the threshold voltage Vth of the Nch transistor may be greater than the amplitude of a sum total video signal which includes the value of the positive/ negative voltage held in a pixel after the increase in voltage. It is this adjustment that makes it possible to open all of switches SW1, SW3, and SW2, even if the inverter circuit illustrated in FIG. 2A or FIG. 2B is not used. What should be done is just to set the gate voltage to a middle point between the threshold voltage Vth of the Nch transistor and the threshold voltage Vth of the Pch transistor at the time of an open action. That is, a pixel circuit which should be kept off has a switch which will not be accidentally closed by the video signal supplied to a signal line (the video signal supplied to another pixel circuit). This structure does not require an inverter, because of which a pixel circuit will be simpler. Improvement in the yield can be therefore expected. Furthermore, in the case of a transmissive liquid crystal display device, improvement in the opening ratio may be expected.

Furthermore, the first switch SW1, the second switch SW2, and the third switch SW3 will be expanded in their respective design flexibilities when an exclusive gate line for gate control of both the first switch SW1 and the third switch SW3 and a further exclusive gate line for gate control of the second switch SW2 are separately provided as illustrated in FIG. 6A. For example, if an N-channel transistor is used to make each of the first switch SW1 and the third switch SW3, then either of a P-channel transistor and an N-channel transistor may be used to make the second switch SW2. In a case where the first switch through the third switch SW1, SW2, and SW3 are the same in channel, the gate signal applied to gate electrode WG2 of the second switch SW2 can be easily made opposite in phase to the gate signal applied to each of gate electrode WG1 of the first switch SW1 and gate electrode WG3 of the third switch SW3 according to the polarities of the gate pulses applied to the two respective gate lines (the exemplary structure is illustrated in FIG. 6A).

FIG. 9 illustrates still another embodiment. In the embodiment of FIG. 7 and FIG. 8, the first switch SW1 and the third switch SW3 are configured in a partially overlapped state each other in plan view. However, in the embodiment of FIG. 9, the first switch SW1 and the second switch SW2 are configured in a partially overlapped (or partially coincide) state each other in plan view. This embodiment also uses a dual-transistor structure. In this structure, it is preferable that the semiconductor layer for switch SW1 is formed using polysilicon at an earlier process, and switch SW2 is formed at a next process using a transparent amorphous oxide semiconductor (TAOS). TAOS may be easily formed at a lower temperature than polysilicon. Accordingly, it is effective to use TAOS.

In FIG. 9, those portions that are the same as those illustrated in FIG. 7 are given identical reference marks. A first switch SW1 is the same in structure as that having been explained with reference to FIG. 7. However, a second switch SW2 is not. Therefore, the second switch SW2 will be explained. The second switch SW2 comprises a semiconductor layer SC2 (P-channel) that is formed on a second insulating layer 12, and is located above a gate electrode WG13.

The second switch SW2 comprising the semiconductor layer SC2 also includes a source electrode WS2 and a drain electrode WD2, both formed on the second insulating layer 12. Switch SW2 is covered with a third insulating layer 13. The third insulating layer 13 also covers the second insulating layer 12. The third insulating layer 13 is formed of a transparent resin material.

The first switch SW1 and the second switch SW32 have gate electrode WG13 in common. The first switch SW1 is a top-gate type. In contrast, the second switch SW2 is a bottom-gate type. The first switch SW1 is an N-channel semiconductor switching device, whereas the second switch SW2 is a P-channel semiconductor switching device. Accordingly, they oppositely close and open, according to gate voltage.

In FIG. 9, the first switch SW1 is a top-gate type, and the second switch SW2 is a bottom-gate type. However, this relation can be reversed. For example, the second switch SW2 may be a top-gate type, and the first switch SW1 may be a bottom-gate type.

The third switch SW3 is not illustrated in FIG. 9. The third switch SW3 is located in a different place from the first switch SW1 and the second switch SW2.

FIG. 10 is a plan view illustrating a place in which the third switch SW3 is located. What is illustrated in FIG. 9 is a cross-section taken along line x1-x2 of FIG. 10. In FIG. 10, source electrode WS1 of the first switch SW1 is connected to the source line S, and drain electrode WD1 of the first switch SW1 is connected through contact holes CH2 and CH3 to a pixel electrode PE. The second switch SW2 overlaps with the first switch SW1 in plan view. Source electrode WS2 is connected to the source line S in the same way as the first switch SW1 does. Accordingly, the source line S has a convex section projecting to source electrode WS2 at a side where the second switch SW2 is located.

The second switch SW2 has a drain electrode WD2. The third switch SW3 has a drain electrode WD3. Drain electrode WD2 of the second switch SW2 is connected through a multifunctional electrode Lb23 to drain electrode WD3 of the third switch SW3. The multifunctional electrode Lb23 is formed on the second insulating layer 12, and the third switch SW3 is formed in the same layer as the first switch SW1. Accordingly, in the event that the multifunctional electrode Lb23 and drain electrode WD3 of the third switch SW3 are connected, they are connected through a contact hole CH6.

The third switch SW3 is formed in the same layer as the first switch SW1, and is arranged in parallel with the first switch SW1. Accordingly, source electrode WS3 of the second switch SW2 is connected through contact holes CH4 and CH5 to the common electrode CE. Moreover, the third switch SW3, the first switch SW1, and the second switch SW2 hold gate electrode WG13 in common.

In the above-mentioned embodiment, the first capacitive element C1 is formed between the pixel electrode PE and drain electrode WD2 of the second switch SW2, and the second capacitive element C2 is formed between the common electrode CE and drain electrode WD2 of the second switch SW2. Accordingly, the area of drain electrode WD2 of the second switch may be arbitrarily adjusted at the time of working out a design.

The multifunctional electrode Lb23 and the common electrode CE form a characteristic shape and pattern. The common electrode CE has an opening CE-O at least at a portion which overlaps with and is opposite to the multifunctional electrode Lb23. The multifunctional electrode Lb23 extends passing through the opening CE-O. It is the opening CE-O that allows the multifunctional electrode Lb23 to have a portion (one of a first portion and a second portion) which coincides with and is directly opposite to the pixel electrode PE. The portion forms capacitive element C1, which has been previously explained, along with the pixel electrode PE. Furthermore, the multifunctional electrode Lb23 has a portion (the other of the first portion and the second portion) which coincides with and is directly opposite to the common electrode CE. The portion forms capacitive element C2, which has been previously explained, along with the branch of the common electrode system CE.

Since capacitive element C1 and capacitive element C2 are structured as mentioned above, all that must be done to determine the value of each capacitive element is simply to adjust the respective areas of the multifunctional electrode Lb23 and the opening CE-O of the common electrode CE. Namely, the multifunctional electrode Lb23 not only connects one semiconductor with another semiconductor but also constitutes a plurality of capacitive elements.

Figure 11:
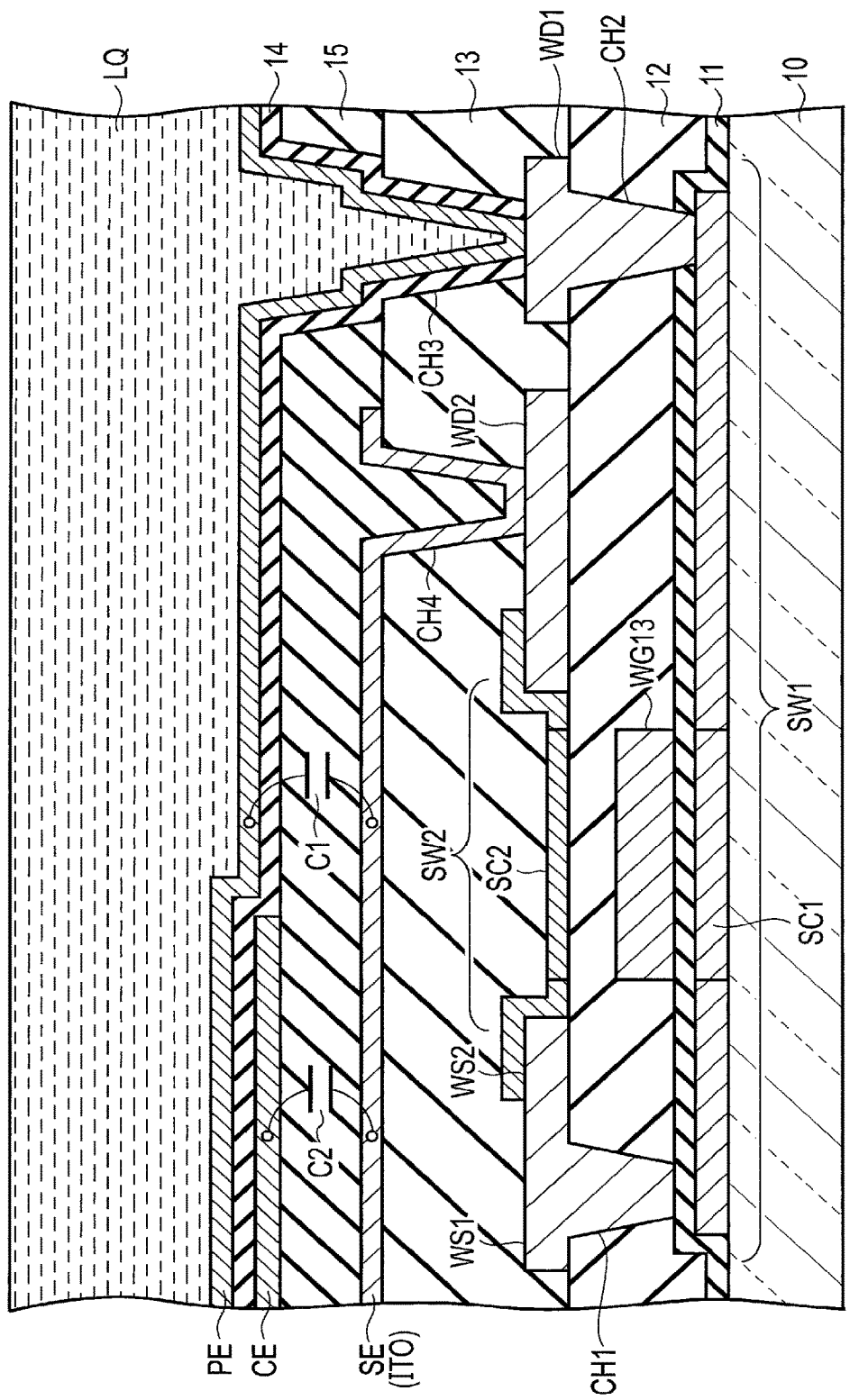
FIG. 11 illustrates a still further embodiment, and is a schematic sectional view structurally illustrating a first switch SW1 and a second switch SW2, each of the switches made of a corresponding one of semiconductor elements formed in a first substrate SUB1.

FIG. 11 illustrates still another embodiment. FIG. 11 is similar to FIG. 9 in structure. Accordingly, those parts that are the same as those illustrated in FIG. 9 are given the same reference marks as those of FIG. 9. The embodiment of FIG. 11 is different from the embodiment of FIG. 9 in that a transparent electrode SE and a fifth insulating layer 15 are provided between a third insulating layer 13 and a fourth insulating layer 14. The transparent electrode SE is formed of, for example, transparent indium tin oxide (ITO), and is located between the fifth insulating layer 15 and the third insulating layer 13. The transparent electrode SE is connected through a contact hole CH4, which is provided in the third insulating layer 13, to a drain electrode WD2 which the second switch SW2 has. The transparent electrode SE forms capacitive element C1 along with the pixel electrode PE, and also forms capacitive element C2 along with a branch of the common electrode system CE. Accordingly, capacitive elements C1 and C2 may be adjusted in their respective values by controlling the area of each of the transparent electrodes SE and CE (by setting their respective areas at the time of production). In the present embodiment, it is also preferable that the semiconductor layer formed by a previous process for making switch SW1 is polysilicon, and that switch SW2 formed by a next process is made of a transparent amorphous oxide semiconductor (TAOS).

In the present embodiment, an electrode, which at least one of the first capacitive element C1 and the second capacitive element C2 has, is partially made of, for instance, an ITO transparent electrode having at least two layers. In FIG. 11, one of electrodes (PE) of the first capacitive element C1 is partially overlapped with the electrodes (CE).

FIG. 12 illustrates a much further embodiment. FIG. 12 is similar to FIG. 7 in structure. Accordingly, those parts that are the same as those illustrated in FIG. 7 are given the same reference marks as those of FIG. 7. The embodiment of FIG. 12 is different from the embodiment of FIG. 7 in that a transparent electrode SE and a fifth insulating layer 15 are provided between a third insulating layer 13 and a fourth insulating layer 14. The transparent electrode SE is formed of, for example, transparent indium tin oxide (ITO), and is located between the fifth insulating layer 15 and the third insulating layer 13. The transparent electrode SE is connected through a contact hole CH4 provided in the third insulating layer 13 to a drain electrode WD2 which the second switch SW2 has.

In the present embodiment, the pixel electrode PE has a slit, and a fringe field switching (FFS) system is used as a system for driving liquid crystal elements between the pixel electrode PE and a branch of the common electrode CE.

In any of the above explanations, the display element LQ is a liquid-crystal-display element. However, the present invention may not be restricted to any of the above-mentioned embodiments. For instance, it is possible that the display element may be an organic EL device, and that the first capacitive element C1 may be used as a driver element for driving the organic EL display device.

The above-mentioned embodiments reveal the following various arrangements for a display device which has a display area and pixels forming a matrix pattern in the display area:

(1) Each of the pixels has at least a first capacitive element C1, a second capacitive element C2, and a display element LQ. The first capacitive element C1 and the second capacitive element C2 are serially connected to constitute a capacitive element series circuit, and the capacitive element series circuit is connected in parallel with the display element LQ. In order to boost an electric potential which the capacitive element series circuit has, each of the pixels further has a boost control circuit which is controlled by a gate signal during one pulse period which an input source signal has. The pulse period of the input source signal comprises a first half and the second half. The boost control circuit comprises some switches which are controlled by the gate signal. At least one of the switches opens in the first half of the pulse period and closes in the second half of the pulse period, whereas the rest of the switches close in the first half of the pulse period and open in the second half of the pulse period.

The boost control circuit described above includes a first switch SW1, a second switch SW2, and a third switch SW3, for example.

(2) The display element LQ described in the above item (1) is controlled an image display state by a voltage signal is given between one terminal and another terminal for the display element LQ.

The capacitive element series circuit comprising the first capacitive element C1 and the second capacitive element C2, one terminal for the first capacitive element C1 is connected to the one terminal for the display element LQ. To the one terminal for the display element LQ, the one terminal for the first switch SW1 is connected, and to another terminal for the first capacitive element C1, one terminal for the second switch SW2 is connected. And, to the aforementioned another terminals for the first and second switch SW1 and SW2, a signal line is connected, also to another terminal for the first capacitive element C1, one terminal for the second capacitive element C2 is connected. Further, to the one terminal for the second capacitive element C2 one terminal for the third switch SW3 is connected, and another terminal for the third switch SW3 is connected to the aforementioned another terminal for the display element LQ.

(3) The device described in the item (2) further has a first gate line for supplying a first gate signal and a second gate line for supplying a second gate signal. Furthermore, the first, second and third switches in the device are made of the same channel type transistors. The first switch and the third switch are controlled by the first gate signal from the first gate line. The second switch is controlled by the second gate signal from the second gate line.

(4) In the device described in the item (2), the first and third switches are constituted by transistors which are of the same channel type. However, the second switch is constituted by a transistor of different channel type from those constituting the first and third switches. The first, second, and third switches are controlled by a gate signal supplied from a corresponding gate line.

(5) In the device described in the item (2), the first switch is paired with the third switch or, alternatively, the first switch is paired with the second switch. In any of the two transistors paired with each other, one of the transistors is a top-gate type, and the other of the transistors is a bottom-gate type.

(6) In the device described in the item (5), each of the top-gate transistor and the bottom-gate transistor has a channel portion which is at least partly formed as a layered structure.

(7) In the device described in the item (2), each of the first capacitive element and the second capacitive element has two electrodes. As one of electrodes at least one of the first capacitive element and the second capacitive element has partially more than two transparent electrodes layers.

(8) In the device described in the item (1), the display element is a liquid-crystal-display element.

(9) In the device described in the item (1), the display element is an organic EL device.

(10) The device described in the above-mentioned item (9) has a built-in circuit which supplies a control signal to control the organic EL device. The boost control circuit which drives the organic EL device has a signal input part to which the control signal from the built-in circuit is supplied.

(11) A display device comprising:
scanning lines extending on a substrate in parallel with the first axis of the substrate;
signal lines extending on the substrate in parallel with a second axis, crossing the scanning lines, and dividing the substrate into sections by cooperation with the scanning lines;
pixel electrodes arranged in the respective sections divided by the scanning lines and the signal lines;
a common electrode being opposite to the pixel electrodes, and an insulating layer interposed between the common electrode and a corresponding one of the pixel electrodes;
capacitive element series circuits, each comprising a serial connection of a first capacitance and a second capacitance, and each of the capacitive element series circuits being connected to between a corresponding one of the pixel electrodes and the common electrode;
boost control circuits each boost the electric potential of corresponding pixel electrode by operating corresponding capacitive element series circuit;
each of the boost control circuits comprising,
a first switch controlled by a gate pulse from a corresponding scanning line, wherein the first switch is switched on or off between the signal line and the pixel electrode,
a second switch controlled by the gate pulse from the corresponding scanning line, wherein the second switch is switched on or off between the signal line and a node of a connecting portion of the first and second capacitive elements, and
a third switch controlled by the gate pulse from the corresponding scanning line, wherein the third switch is switched on or off between the signal line and the node of the connecting portion of the first and second capacitive elements; and
multifunctional electrode connected between the node and a connecting portion of the second switch and the third switch, the multifunctional electrode forming the first capacitance with the pixel electrode, and forming the second capacitance with the common electrode.

(12) In the item (11), the multifunctional electrode forming the first capacitance at an opening of the common electrode.

(13) The device of the item (11) the multifunctional electrode extending between a layer having the common electrode and a layer of the second switch.

(14) In the above item (11), the first switch and the third switch are semiconductor switches of the same channel type, and the second switch is semiconductor switch of different channel type from the first switch and the third switch.

(15) In the item (11), the first switch and the third switch constitute a multilayer structure.

(16) In the item (11), the first switch and the second switch constitute a multilayer structure.

(17) A display device having a display area wherein pixels are formed like matrix pattern, each of the pixels comprising:
a capacitive element series circuit, including a first capacitive element C1 being connected in series to a second capacitive element C2, the capacitive element series circuit being connected in parallel to a display element LQ;
a first switch SW1 comprising a first semiconductor layer SC1 on the first substrate and a gate electrode WG13 on an insulating layer on the first semiconductor layer SC1;
a second switch SW2 comprising a second semiconductor layer SC2 on the first substrate and a gate electrode WG13 on an insulating layer on the second semiconductor layer SC2;
a third switch SW3 comprising a third semiconductor layer SC3 on an insulating layer on the gate electrode WG13, the third switch SW3 being partially overlapped to the first semiconductor layer SC1;
a common electrode CE lying on an insulating layer on the third semiconductor layer SC3, being drawn out to an outside of the display area, and being supplied a common voltage;
a pixel electrode PE lying on a corresponding area of an insulating layer on the common electrode CE and connected to one terminal of the first switch SW1 through a contact hole; and
a multifunctional electrode Lb23 connecting the third switch SW3 and the second switch SW2, wherein the common electrode CE has an opening CE-O, and the opening CE O allows the multifunctional electrode Lb23 and the pixel electrode PE to form capacitive element C1, and allows the multifunctional electrode Lb23 and the common electrode CE opposite to the multifunctional electrode Lb23 to form the second capacitive element C2.

(18) A display device having a display area wherein pixels are formed like matrix pattern, each of the pixels comprising:
a first switch SW1 comprising a first semiconductor layer SC1 on the first substrate and a gate electrode WG13 on an insulating layer on the first semiconductor layer SC1;
a second switch SW2 comprising a second semiconductor layer SC2 on an insulating layer on the gate electrode WG13, the third switch SW3 being partially overlapped to the first semiconductor layer SC1;
a third switch SW3 comprising a third semiconductor layer SC3 on the first substrate and a gate electrode WG13 on an insulating layer on the third semiconductor layer SC3;
a common electrode CE lying on an insulating layer on the second semiconductor layer SC2, being drawn out to an outside of the display area, and being supplied a common voltage;
a pixel electrode PE lying on a corresponding area of an insulating layer on the common electrode CE and connected to one terminal of the first switch SW1 through a contact hole; and
a multifunctional electrode Lb23 connecting the second switch SW2 and the third switch SW3, wherein the common electrode CE has an opening CE-O, and the opening CE O allows the multifunctional electrode Lb23 and the pixel electrode PE to form capacitive element C1, and allows the multifunctional electrode Lb23 and the common electrode CE opposite to the multifunctional electrode Lb23 to form the second capacitive element C2.

(19) In the item (17) or (18), the first and third switches are constituted by semiconductor devices of the same channel type (N- or P-channel), and the second switch is constituted by a semiconductor device of different channel type from that of the semiconductor devices constituting the first and third switches.

(20) In the item (17) or (18), the first and second capacitive elements C1 and C2 constitute a boost circuit in cooperation with the first through third switches.

(21) A display device comprising liquid crystal layer between a first substrate and a second substrate, the first substrate having a plurality of source lines to receive source signals, and having a plurality of gate lines to receive gate signals to control semiconductors, and pixel circuits being formed in respective sections being divided by the gate lines and source lines, each of the pixel circuits comprising:

a pixel electrode prepared by the side of the liquid crystal layer of the first substrate;

a common electrode which had countered the pixel electrode through the insulating layer, and is prepared at the first substrate side;

a first semiconductor switch of N- or P-channel type having a source electrode connected to one of the source lines, a drain electrode connected to the pixel electrode, and a gate electrode connected to one of the gate lines;

a second semiconductor switch different in channel from the first semiconductor switch;

a third semiconductor switch identical in channel to the first semiconductor switch having a source electrode connected to the common electrode, a gate electrode connected to the said one of the gate lines;

a multifunctional electrode connecting the drain of the second semiconductor switch and the drain of the third semiconductor switch, and having a first region and a second region, the first region facing the pixel electrode through the opening of the common electrode, and the second region facing the common electrode;

a first capacitor comprising the pixel electrode and the first region of the multifunctional electrode; and a second capacitor comprising the second region of the multifunctional electrode and the said one of the branches of the common electrode.

(22) A display device having a display area wherein pixels are formed like matrix pattern, each of the pixels comprising:

a first semiconductor switch having a source electrode connected to a corresponding source line, and a drain electrode connected to a pixel electrode;

a second semiconductor switch having a source electrode connected to the source line, and a drain electrode;

a third semiconductor switch having a source electrode connected to a common electrode, and a drain electrode;

a multifunctional electrode connecting the drain electrode of the second semiconductor switch and the drain electrode of the third semiconductor switch, and having a first region and a second region, the first region facing the pixel electrode through a opening of the common electrode, and the second region facing the branched common electrode;

a first capacitive element comprising the pixel electrode and the first region of the multifunctional electrode;

a second capacitive element comprising the said one of the branched common electrodes and the second region of the multifunctional electrode; and a liquid crystal element driven by an electric field generated between the pixel electrode and the said one of the branched common electrodes.

(23) A control method applied to a display device comprising a substrate; scanning lines; signal lines crossing the scanning lines; partition areas defined on the substrate by the scanning lines and the signal lines; pixels arranged at the partition areas, each of the pixels which includes a pixel electrode, a common electrode, an insulating layer between the pixel electrode and the common electrode, a capacitor circuit comprising a first capacitor serially connected to a second capacitor, and the capacitor circuit connected between the pixel electrode and the common electrode; and a boost control circuit provided in each of the pixels, the boost control circuit causing the capacitor circuit to accumulate a holding voltage, the control method comprising:

applying the image signal to the signal line; and changing the gate pulse from one of polarities to other during the image signal being applied to the signal line, thereby boosting up the holding voltage.

(24) In the above item (23), wherein the boost control circuit comprising, charging a first level by applying the image signal to a first part of the capacitor circuit during the gate pulse being the positive polarity, and applying the image signal to a second part of the capacitor circuit during the gate pulse being the negative polarity, thereby boosting up the voltage potential of the pixel electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Furthermore, the technical terms used above in relation to the embodiments and the names or technical terms described in the drawings are in no way restrictive.

What is claimed is:

1. A display device having a display area wherein pixels are arranged in a matrix pattern, each of the pixels comprising:

a display element;

a capacitive element series circuit connected in parallel with the display element, and comprising at least a first capacitive element and a second capacitive element; and a boost circuit making an electric potential of the capacitive element series circuit increase to obtain a boosted electric potential, and applying the boosted electric potential to the display element, the boost circuit having a plurality of switches, each controlled in respect of opening and closing by a gate signal during one pulse period of an input source signal, at least one of the switches opening in a first half of the pulse period and closing in a second half of the pulse period, whereas the rest of the switches closing in the first half of the pulse period and opening in the second half of the pulse period.

2. The display device of claim 1, wherein the display element controls an image display state upon a voltage signal being given between one terminal and another terminal for the display element, one terminal of the first capacitive element contained in the capacitive element series circuit is connected to the one terminal of the display element, one terminal of the first switch included in the boost circuit is connected to the one terminal of the display element, one terminal of the second switch included in the boost circuit is connected to another terminal of the first capacitive element, each of another terminals of the first switch and the second switch is connected to a signal line, one terminal of the second capacitive element contained in the capacitive element series circuit is connected to the aforementioned another terminal of the first capacitive element, moreover, another terminal of the second capacitive element is connected to the aforementioned another terminal of the display element, one terminal of the third switch included in the boost circuit is connected to the aforementioned another terminal of the first capacitive element, and another terminal of this third switch is connected to the aforementioned another terminal of the display element.

3. The display device of claim 2, wherein each of the pixels further has a first gate line and a second gate line, the first, second, and third switches in each of the pixels are transistors of identical channel type, and the first and third switches are controlled by a first gate signal from the first gate line, whereas the second switch is controlled by a second gate signal from the second gate line.

4. The display device of claim 2, wherein each of the pixels further connected to a corresponding gate line, the first and third switches in each of the pixels are transistors of identical channel type, the second switch in each of the pixels is a transistor different in channel type from the first and third switches, and the first, second and third switches are all controlled by the gate signal from the gate line.

5. The display device of claim 2, wherein the first switch is paired with the third switch or, alternatively, the first switch is paired with the second switch, and any of the two transistors paired with each other, one of the transistors is a top-gate type, and the other of the transistors is a bottom-gate type.

6. The display device of claim 5, wherein channel portions of transistors of the top-gate type and the bottom-gate type are partly overlapped layer.

7. The display device of claim 2, wherein one of electrodes of at least one of the first capacitive element and the second capacitive element has partially more than two transparent electrodes layers.

8. The display device of claim 1, wherein the display element in each of the pixels is a liquid-crystal-display element.

9. The display device of claim 1, wherein the display element in each of the pixels is an organic EL device.

10. The display device of claim 1, wherein the display element in each of the pixels is an organic EL device, the boost circuit in each of the pixels has a signal input part and drives the organic EL device, and each of the pixels further has a built-in circuit to supply a control signal to the signal input part of the boost circuit for controlling the organic EL device.

* * * * *